(12) United States Patent
Miyairi et al.

(10) Patent No.: US 8,735,897 B2
(45) Date of Patent: May 27, 2014

(54) SEMICONDUCTOR DEVICE

(75) Inventors: Hidekazu Miyairi, Atsugi (JP); Koji Dairiki, Atsugi (JP); Satoshi Toriumi, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 693 days.

(21) Appl. No.: 13/045,951

(22) Filed: Mar. 11, 2011

(65) Prior Publication Data

US 2011/0220907 A1    Sep. 15, 2011

(30) Foreign Application Priority Data

Mar. 15, 2010    (JP) .................. 2010-058529

(51) Int. Cl.
*H01L 29/786* (2006.01)
(52) U.S. Cl.
USPC .............. 257/72; 257/66; 257/E29.273
(58) Field of Classification Search
USPC .............. 257/72, 66, E29.273
See application file for complete search history.

(56) References Cited

U.S. PATENT DOCUMENTS

| | | | |
|---|---|---|---|
| 4,409,134 A | 10/1983 | Yamazaki | |
| 6,153,893 A | 11/2000 | Inoue et al. | |
| 7,551,655 B2 | 6/2009 | Tanaka et al. | |
| 7,768,009 B2 | 8/2010 | Kobayashi et al. | |
| 2009/0020759 A1 | 1/2009 | Yamazaki | |
| 2009/0021664 A1 | 1/2009 | Yamazaki | |
| 2009/0029498 A1 * | 1/2009 | Yamazaki et al. | 438/30 |
| 2009/0033818 A1 | 2/2009 | Nakajima et al. | |
| 2009/0047774 A1 * | 2/2009 | Yamazaki | 438/479 |
| 2009/0090915 A1 | 4/2009 | Yamazaki et al. | |
| 2009/0114921 A1 | 5/2009 | Yamazaki et al. | |
| 2010/0032679 A1 | 2/2010 | Kawae et al. | |
| 2010/0096631 A1 | 4/2010 | Miyairi et al. | |

FOREIGN PATENT DOCUMENTS

| | | |
|---|---|---|
| JP | 02-182880 | 7/1990 |
| JP | 05-129608 | 5/1993 |
| JP | 06-333949 | 12/1994 |
| JP | 07-131030 | 5/1995 |
| JP | 2001-053283 | 2/2001 |
| JP | 2005-049832 | 2/2005 |
| JP | 2005-191546 | 7/2005 |
| JP | 2010-109341 | 5/2010 |
| JP | 2010-123925 | 6/2010 |

OTHER PUBLICATIONS

Kanicki, "3.1.2.3 Optical Properties," Amorphous & Microcrystalline Semiconductor Devices, pp. 97-103.
Kanicki, "3.2.1 Hydrogenated Microcrystalline Silicon Carbon," Amorphous & Microcrystalline Semiconductor Devices, pp. 114-116.

* cited by examiner

*Primary Examiner* — Marc Armand
(74) *Attorney, Agent, or Firm* — Eric J. Robinson; Robinson Intellectual Property Law Office, P.C.

(57) ABSTRACT

In an inverted staggered thin film transistor, a microcrystalline silicon film and a pair of silicon carbide films are provided between a gate insulating film and wirings serving as a source wiring and a drain wiring. The microcrystalline silicon film is formed on the gate insulating film side and the pair of silicon carbide films are formed on the wiring side. In such a manner, a semiconductor device having favorable electric characteristics can be manufactured with high productivity.

31 Claims, 16 Drawing Sheets

127 141 139   129   139 141 127

SEMICONDUCTOR DEVICE

BACKGROUND OF THE INVENTION

1. Field of the Invention

The present invention relates to a semiconductor device and a manufacturing method thereof.

2. Description of the Related Art

As one type of field-effect transistor, a thin film transistor whose channel region is formed using a semiconductor film which is formed over a substrate having an insulating surface is known. Techniques in which amorphous silicon, microcrystalline silicon, or polycrystalline silicon is used for the semiconductor film which is used for the channel region of the thin film transistor have been disclosed (see Patent Documents 1 to 5). A typical application of thin film transistors is a liquid crystal display television device, in which thin film transistors have been put to practical use as a switching transistor for each pixel that constitutes a display screen.

REFERENCE

[Patent Document 1] Japanese Published Patent Application No. 2001-053283

[Patent Document 2] Japanese Published Patent Application No. H5-129608

[Patent Document 3] Japanese Published Patent Application No. 2005-049832

[Patent Document 4] Japanese Published Patent Application No. H7-131030

[Patent Document 5] Japanese Published Patent Application No. 2005-191546

SUMMARY OF THE INVENTION

A thin film transistor in which a channel region is formed using an amorphous silicon film has problems of low field-effect mobility and low on-state current. On the other hand, a thin film transistor in which a channel region is formed using a microcrystalline silicon film has a problem in that, though the field-effect mobility is improved, the off-state current is higher than that of the thin film transistor whose channel region is formed using an amorphous silicon film and thus sufficient switching characteristics cannot be obtained.

A thin film transistor in which a channel formation region is formed using a polycrystalline silicon film has characteristics in that the field-effect mobility is far higher than those of the above-described two kinds of thin film transistors and high on-state current can be obtained. Because of such characteristics, this thin film transistor can be used not only as a switching transistor provided in a pixel but also in a driver circuit for which high-speed operation is required.

However, a manufacturing process of the thin film transistor whose channel region is formed using a polycrystalline silicon film involves a crystallization step for a semiconductor film and has a problem of higher manufacturing costs, as compared to a manufacturing process of the thin film transistor whose channel region is formed using an amorphous silicon film. For example, a laser annealing technique in the process for forming a polycrystalline silicon film has a problem in that large-screen liquid crystal panels cannot be produced efficiently because the area capable of being irradiated with the laser beam is small.

A glass substrate for manufacturing display panels has been grown in size as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm) and the 10th generation (2950 mm×3400 mm) The increase in size of the glass substrate is based on the concept of minimum cost design.

On the other hand, a technique with which a thin film transistor capable of high-speed operation can be manufactured with high productivity over a large-area mother glass substrate like that of the 10th generation (2950 mm×3400 mm) has not been established yet, which is a problem in industry.

Therefore, it is an object of an embodiment of the present invention to provide a semiconductor device which has favorable electric characteristics. It is an object of one embodiment of the present invention to provide a method for manufacturing a semiconductor device having favorable electric characteristics with high productivity.

In one embodiment of the present invention, in an inverted staggered thin film transistor, a microcrystalline silicon film and a pair of silicon carbide films are provided between a gate insulating film and wirings serving as a source wiring and a drain wiring, the microcrystalline silicon film is formed on the gate insulating film side, and the pair of silicon carbide films are formed on the wiring side.

Further, another embodiment of the present invention is a semiconductor device including a gate electrode over a substrate; a gate insulating film covering the gate electrode; a microcrystalline silicon film over the gate insulating film; a pair of amorphous silicon carbide films over the microcrystalline silicon film; impurity semiconductor films serving as a source and drain regions over the pair of amorphous silicon carbide films; wirings in contact with the impurity semiconductor films; an insulating film covering the microcrystalline silicon film, the pair of amorphous silicon carbide films, the pair of impurity semiconductor films, and the wirings; and a back-gate electrode over the insulating film. Note that a pair of microcrystalline silicon films including carbon may be provided between the microcrystalline silicon film and the pair of amorphous silicon carbide films. Alternatively, a pair of microcrystalline silicon films including nitrogen and a pair of amorphous silicon carbide films including nitrogen may be provided between the microcrystalline silicon film and the pair of amorphous silicon carbide films. Alternatively, a pair of microcrystalline silicon films including nitrogen and the pair of microcrystalline silicon carbide films may be provided between the microcrystalline silicon film and the pair of amorphous silicon carbide films. Alternatively, a pair of microcrystalline silicon films including carbon and nitrogen and a pair of amorphous silicon films including carbon and nitrogen may be provided between the microcrystalline silicon film and the pair of amorphous silicon carbide films.

Further, another embodiment of the present invention is a semiconductor device including a gate electrode over a substrate; a gate insulating film covering the gate electrode; a microcrystalline silicon film over the gate insulating film; a pair of microcrystalline silicon carbide films over the microcrystalline silicon film; impurity semiconductor films serving as a source and drain regions over the pair of microcrystalline silicon carbide films; wirings in contact with the impurity semiconductor films; an insulating film covering the microcrystalline silicon film, the pair of microcrystalline silicon carbide films, the pair of impurity semiconductor films, and the wirings; and a back-gate electrode over the insulating film. Note that a pair of microcrystalline silicon films including carbon may be provided between the microcrystalline silicon film and the pair of microcrystalline silicon carbide films. Alternatively, a pair of microcrystalline silicon films including nitrogen may be provided between the microcrystalline silicon film and the pair of microcrystalline silicon carbide films. Alternatively, a pair of microcrystalline silicon films including carbon and nitrogen may be provided between the microcrystalline silicon film and the pair of microcrystalline silicon carbide films.

The nitrogen concentration profile of the amorphous silicon film including nitrogen has a peak concentration greater than or equal to $1\times10^{20}$ atoms/cm$^3$ and less than or equal to $1\times10^{21}$ atoms/cm$^3$, preferably greater than or equal to $2\times10^{20}$ atoms/cm$^3$ and less than or equal to $1\times10^{21}$ atoms/cm$^3$. Further, in the amorphous silicon film including nitrogen, a silicon crystal particle whose grain size is greater than or equal to 1 nm and less than or equal to 10 nm may be dispersed. Here, the concentration is a value measured by secondary ion mass spectrometry (SIMS) unless a method for measuring the concentration is mentioned.

Further, in one embodiment of the present invention, insulating regions may be provided between the microcrystalline silicon film and the pair of silicon carbide films, and the source electrode and the drain electrode.

A semiconductor device having favorable electric characteristics can be manufactured with high productivity.

DETAILED DESCRIPTION OF THE INVENTION

Figure 1A:
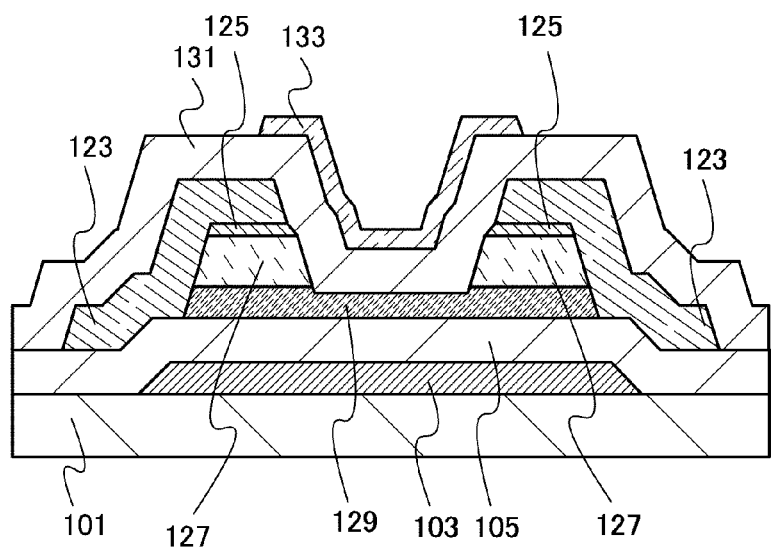
FIGS. 1A and 1B are cross-sectional views illustrating a semiconductor device according to one embodiment of the present invention.

Hereinafter, embodiments of the present invention are described with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments and examples. Note that reference numerals denoting the same portions are commonly used in different drawings.

Note that the size, the thickness of a layer, and a region of each structure illustrated in the drawings and the like in the embodiments are exaggerated for simplicity in some cases. Therefore, embodiments of the present invention are not limited to such scales.

Note that on-state current refers to a current which flows between a source electrode and a drain electrode when a thin film transistor is on. For example, in the case of an n-channel thin film transistor, on-state current refers to a current which flows between a source electrode and a drain electrode when gate voltage is higher than the threshold voltage of the thin film transistor.

In addition, off-state current refers to a current which flows between a source electrode and a drain electrode when a thin film transistor is off. For example, in the case of an n-channel thin film transistor, off-state current refers to a current which flows between a source electrode and a drain electrode when gate voltage is lower than the threshold voltage of the thin film transistor.

Embodiment 1

In this embodiment, the cross-sectional structure of a thin film transistor which can be used for a semiconductor device according to one embodiment of the present invention is described with reference to FIGS. 1A and 1B. Note that an n-channel thin film transistor has higher carrier mobility than a p-channel thin film transistor. Further, it is preferable that all thin film transistors formed over the same substrate have the same polarity because the number of manufacturing steps can be reduced. In this embodiment, an n-channel thin film transistor is described.

A thin film transistor illustrated in FIG. 1A has a gate electrode 103, a microcrystalline silicon film 129, a gate insulating film 105 between the gate electrode 103 and the microcrystalline silicon film 129, a pair of amorphous silicon carbide films 127 over the microcrystalline silicon film 129, impurity semiconductor films 125 serving as a source region and a drain region over the pair of amorphous silicon carbide films 127, and wirings 123 in contact with the impurity semiconductor films 125 over a substrate 101. Further, an insulating film 131 covering the microcrystalline silicon film 129, the pair of amorphous silicon carbide films 127, the pair of impurity semiconductor films 125, and the wirings 123 may be provided. Furthermore, an electrode overlapping with at least a gate electrode 103 and the microcrystalline silicon film 129 may be provided over the insulating film 131. Here, the electrode over the insulating film 131, which overlaps with at least the gate electrode 103 and the microcrystalline silicon film 129, is shown as a back-gate electrode 133.

Figure 1B:
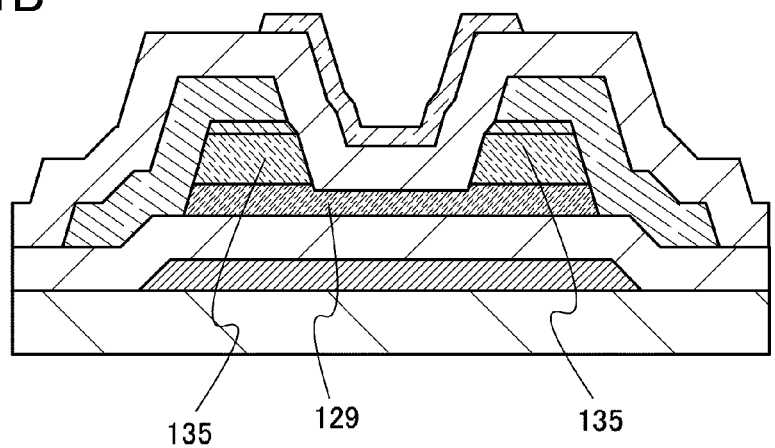

A thin film transistor illustrated in FIG. 1B is different from the thin film transistor illustrated in FIG. 1A in that a pair of microcrystalline silicon carbide films 135 are provided instead of the pair of the amorphous silicon carbide films 127 over the microcrystalline silicon film 129. The pair of microcrystalline silicon carbide films 135 can have a crystal structure by growing a crystal using the microcrystalline silicon film 129 as a seed crystal.

Further, in the thin film transistor illustrated in FIGS. 1A and 1B, an interface between the microcrystalline silicon film 129 and the pair of amorphous silicon carbide films 127 or the pair of microcrystalline silicon carbide films 135 is flat. The pair of amorphous silicon carbide films 127 or the pair of microcrystalline silicon carbide films 135 are formed over the microcrystalline silicon film 129 in the following manner. The pair of amorphous silicon carbide films 127 or the pair of microcrystalline silicon carbide films 135 are formed under a condition that crystals of the microcrystalline silicon film 129 are not partly grown.

The thin film transistor illustrated in FIGS. 1A and 1B has the pair of silicon carbide films between the microcrystalline silicon film 129 serving as a channel region and the impurity semiconductor films 125 serving as the source region and the drain region. The band gap of the silicon carbide film is wider than that of the microcrystalline silicon film. Specifically, the band gap of microcrystalline silicon is greater than or equal to 1.0 eV and less than or equal to 1.2 eV, and the band gap of amorphous silicon is greater than or equal to 1.6 eV and less than or equal to 1.8 eV. The band gap of 4H-silicon carbide is approximately 3.26 eV. The band gap can be controlled by control of the concentration of carbon in the silicon carbide.

Here, the attention is attracted to semiconductor junction of an impurity semiconductor film (an n-type semiconductor film, for example) forming a drain region and a semiconductor film (an i-type semiconductor film, for example) forming a channel region of a conventional transistor. In the case where reverse voltage at a given value or higher is applied to a drain, tunnel current passing through the potential barrier of the semiconductor junction flows, whereby off-state current is increased.

However, as illustrated in FIG. 1A, in the case where the amorphous silicon carbide films 127 with a wide band gap are provided between the impurity semiconductor films 125 and the microcrystalline silicon film 129, the probability of tunneling is reduced and the above-described tunnel current which makes carriers flow from the valence band of the microcrystalline silicon film 129 to the conduction band of the impurity semiconductor films 125 is decreased. Accordingly, off-state current can be reduced. Furthermore, in the case where the thin film transistor is driven by AC driving, the source region and the drain region are switched by the polarity of AC voltage. Therefore, by the formation of the silicon carbide film with the band gap which is wider than that of conventional amorphous silicon in the vicinity of the source region and the drain region to which an electric field is applied, off-state current of the thin film transistor can be reduced.

Next, components of the thin film transistor are described below.

As the substrate 101, a glass substrate; a ceramic substrate; a plastic substrate which has high heat resistance enough to withstand a process temperature of this manufacturing process; or the like can be used. In the case where the substrate does not need a light-transmitting property, a metal substrate, such as a stainless steel alloy substrate, provided with an insulating film on its surface may be used. As the glass substrate, for example, an alkali-free glass substrate of barium borosilicate glass, aluminoborosilicate glass, aluminosilicate glass, or the like may be used. Note that there is no limitation on the size of the substrate 101. For example, any of a glass substrates of the 3rd to 10th generations which is often used in the field of the above flat panel display can be used.

The gate electrode 103 can be formed as a single layer or a stacked layer using a metal material such as molybdenum, titanium, chromium, tantalum, tungsten, aluminum, copper, neodymium, scandium, or nickel or an alloy material which includes any of these materials as a main component. A semiconductor typified by polycrystalline silicon doped with an impurity element such as phosphorus, an AgPdCu alloy, an Al—Nd alloy, an Al—Ni alloy, or the like may be used.

For example, the following structure is preferable as a two-layer structure of the gate electrode 103: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; a two-layer structure in which a titanium nitride film and a molybdenum film are stacked; a two-layer structure in which a copper-magnesium alloy film containing oxygen and a copper film are stacked; a two-layer structure in which a copper-manganese alloy film containing oxygen and a copper film are stacked; a two-layer structure in which a copper-manganese alloy film and a copper film are stacked; and the like. As a three-layer structure, it is preferable to stack a tungsten film or a tungsten nitride film, an alloy film of aluminum and silicon or an alloy film of aluminum and titanium, and a titanium nitride film or a titanium film. By a stack of a metal film serving as a barrier film over a film having low electric resistance, electric resistance can be made low and diffusion of a metal element from the metal film into the silicon film can be prevented.

The gate insulating film 105 can be formed as a single layer or a stacked layer including a silicon oxide film, a silicon nitride film, a silicon oxynitride film, a silicon nitride oxide film, an aluminum oxide film, an aluminum nitride film, and/or an aluminum nitride oxide film by a CVD method, a sputtering method, or the like. Further, by the formation of the gate insulating film 105 including silicon oxide film or silicon oxynitride film, fluctuation in the threshold voltage of the thin film transistor can be suppressed.

Note that silicon oxynitride means silicon that includes more oxygen than nitrogen. In the case where measurements are performed using Rutherford backscattering spectrometry (RBS) and hydrogen forward scattering spectrometry (HFS), silicon oxynitride includes oxygen, nitrogen, silicon, and hydrogen as composition ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are performed using RBS and HFS, silicon nitride oxide preferably contains oxygen, nitrogen, silicon, and hydrogen as composition ranging from 5 at. % to 30 at. %, 20 at. % to 55 at. %, 25 at. % to 35 at. %, and 10 at. % to 30 at. %, respectively. Note that the percentages of nitrogen, oxygen, silicon, and hydrogen fall within the ranges given above, where the total number of atoms contained in silicon oxynitride or silicon nitride oxide is defined as 100 at. %.

The microcrystalline silicon film 129 is silicon having an intermediate structure between an amorphous structure and a crystalline structure (including a single crystal structure and a polycrystalline structure). Microcrystalline silicon is a semiconductor having a third state that is stable in terms of free energy and crystalline silicon having short-range order and lattice distortion, in which columnar or needle-like crystals each having a crystal grain size greater than or equal to 2 nm and less than or equal to 200 nm, preferably greater than or equal 10 nm and less than or equal to 80 nm, more preferably greater than or equal 20 nm and less than or equal to 50 nm have grown in a direction normal to the substrate surface. Therefore, a crystal grain boundary is formed at the interface of the columnar or needle-like crystal grains in some cases. Note that the crystal grain size here means the maximum diameter of a crystal grain in a plane parallel to the substrate surface. Further, the crystal grain includes an amorphous silicon region and a crystallite which is a minute crystal that can be regarded as a single crystal. The crystal grain may include a twin crystal.

The Raman spectrum of microcrystalline silicon is shifted to a lower wave number side than 520 cm$^{-1}$ that represents single crystal silicon. That is, the peak of a Raman spectrum of microcrystalline silicon is within the range from 520 cm$^{-1}$ which represents single crystal silicon, to 480 cm$^{-1}$ which represents amorphous silicon. Microcrystalline silicon includes at least 1 at. % or more of hydrogen or halogen to terminate a dangling bond. Moreover, the microcrystalline semiconductor may contain a rare gas element such as helium, argon, krypton, or neon to further promote lattice distortion, so that stability is increased and a favorable microcrystalline semiconductor can be obtained. Such a microcrystalline semiconductor is disclosed in, for example, U.S. Pat. No. 4,409,134.

The pair of amorphous silicon carbide films 127 may include amorphous silicon. For example, amorphous silicon may be dispersed in the amorphous silicon carbide films. Further, the concentration of carbon in the amorphous silicon carbide films may be gradually increased from the lower parts to the upper parts of the amorphous silicon carbide films. Note that, in this case, a region where the amount of carbon which does not satisfy the stoichiometric proportion of the silicon carbide is included is amorphous silicon containing carbon.

The pair of microcrystalline silicon carbide films 135 may include amorphous silicon carbide between the microcrystalline silicon carbide grains. Alternatively, amorphous silicon may be included between the microcrystalline silicon carbide grains.

The band gaps of amorphous silicon carbide and microcrystalline silicon carbide are wider than that of microcrystalline silicon. When a negative voltage is applied to the gate electrode 103 and a voltage is applied to one of the wirings 123, tunnel current in amorphous silicon carbide and microcrystalline silicon carbide is decreased. Therefore, off-state current of the thin film transistor can be reduced.

The impurity semiconductor films 125 are formed using amorphous silicon to which phosphorus is added, microcrystalline silicon to which phosphorus is added, or the like. Alternatively, the impurity semiconductor films 125 can have a stacked structure of amorphous silicon to which phosphorus is added and microcrystalline silicon to which phosphorus is added. Note that, in the case where a p-channel thin film transistor is formed as a thin film transistor, the impurity semiconductor films 125 are formed using microcrystalline silicon to which boron is added, amorphous silicon to which boron is added, or the like. Note that, in the case where ohmic contacts are formed between the silicon carbide film and the wirings 123 which are formed later, the impurity semiconductor films 125 are not necessarily formed.

The wirings 123 can be formed as a single layer or a stacked layer using any of aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode 103) may also be used. Alternatively, crystalline silicon to which an impurity element which serves as a donor is added may be used. A stacked-layer structure in which a film on the side that is in contact with the crystalline silicon to which an impurity element serving as a donor is added is formed using titanium, tantalum, molybdenum, tungsten, or nitride of any of these elements, and a layer of aluminum or an aluminum alloy is formed thereover may be formed. Further alternatively, a stacked-layer structure in which an upper side and a lower side of aluminum or an aluminum alloy is sandwiched together with titanium, tantalum, molybdenum, tungsten, or nitride of any of these elements may be formed.

The insulating film 131 serves as a protective film in order to prevent contaminants from the outside from entering the microcrystalline silicon film 129 and the pair of amorphous silicon carbide films 127 or the pair of microcrystalline silicon carbide films 135. The insulating film 131 may be formed using a material which is similar to that of the gate insulating film 105.

The thin film transistor described in this embodiment includes the pair of silicon carbide films with a wide band gap between the microcrystalline silicon film 129 serving as the channel region and the impurity semiconductor films 125 serving as the source region and the drain region. Therefore, off-state current of the thin film transistor is low. Accordingly, with the use of the thin film transistor as a pixel switching element, a display device with high contrast and high image quality can be manufactured. Furthermore, in electric charge stored in a storage capacitor, the amount of electric charge discharged by off-state current of the thin film transistor can be reduced. Accordingly, the size of the storage capacitor can be reduced. When the storage capacitor is small, current capability needed for storing electric charge can be reduced. Therefore, the areas of the thin film transistor and the storage capacitor can be reduced. The aperture ratio of a pixel is increased and the transmittance of a backlight is improved. Consequently, the amount of light from the backlight can be reduced. Further, low power consumption can be realized. By the reduction in the size of the storage capacitor in each pixel, a load on a driver circuit is reduced. Therefore, the size of the thin film transistor in the driver circuit portion can be reduced, and the frame of the display device can be narrowed. Furthermore, by the reduction in the load on the driver circuit and improvement in the aperture ratio of the pixel, the definition of the display device can be increased. Therefore, a high-definition large display can be manufactured. The number of pixels in the display is 2 k×4 k or 4 k×8 k. Moreover, by the reduction in the load on the driver circuit, high-speed drive can be performed, and a high-definition large display can operate at high speed or a high-definition large three-dimensional display can be manufactured.

Embodiment 2

In this embodiment, a thin film transistor whose structure is different from the structure described in Embodiment 1 is described with reference to FIGS. 2A and 2B.

Figure 2A:
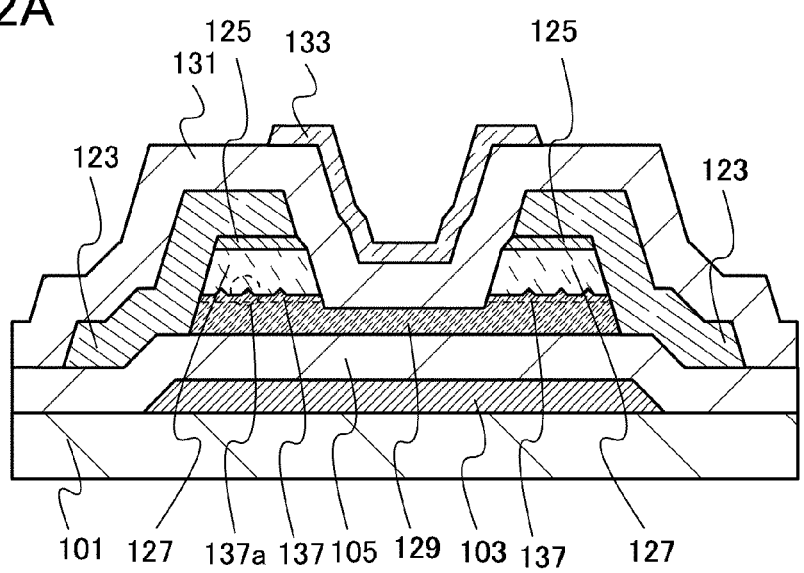
FIGS. 2A and 2B are cross-sectional views illustrating a semiconductor device according to one embodiment of the present invention.
Figure 2B:
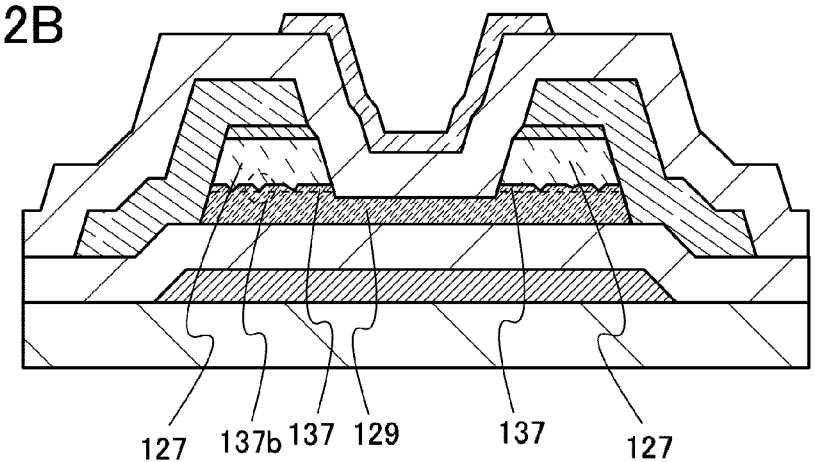

The thin film transistor illustrated in FIG. 2A has a gate electrode 103, a microcrystalline silicon film 129, a gate insulating film 105 between the gate electrode 103 and the microcrystalline silicon film 129, a pair of microcrystalline silicon films 137 including carbon in contact with the microcrystalline silicon film 129, a pair of amorphous silicon carbide films 127 in contact with the pair of microcrystalline silicon films 137 including carbon, impurity semiconductor films 125 serving as a source region and a drain region in contact with the pair of amorphous silicon carbide films 127, and wirings 123 in contact with the impurity semiconductor films 125 over a substrate 101. Further, an insulating film 131 covering the microcrystalline silicon film 129, the pair of amorphous silicon films 137 including carbon, the pair of amorphous silicon carbide films 127, the pair of impurity semiconductor films 125, and the wirings 123 may be provided. Furthermore, a back-gate electrode 133 overlapping with at least a gate electrode 103 and the microcrystalline silicon film 129 may be provided over the insulating film 131.

The amount of carbon included in the microcrystalline silicon films 137 including carbon is smaller than the stoichiometric proportion of silicon carbide. That is, the stoichiometric proportion of silicon and carbon in the microcrystalline silicon films 137 is Si:C=1:x (0<x<1). The microcrystalline silicon films 137 including carbon are formed in the following manner. At an early stage of deposition of the silicon carbide film, the flow rate of gas containing carbon is reduced, whereby a crystal grows using the microcrystalline silicon film 129 as a seed crystal.

FIG. 2A illustrates a cross section of the pair of microcrystalline silicon films 137 including carbon and having a projected portion 137a on the surface thereof. As illustrated in FIG. 2B, the pair of microcrystalline silicon films 137 including carbon may have a cross section where a recessed portion 137b is provided on a surface thereof.

The band gap and the electron affinity of the microcrystalline silicon film 129 are different from those of the pair of amorphous silicon carbide films 127. Therefore, a heterojunction is formed at the interface between the microcrystalline silicon film 129 and the pair of amorphous silicon carbide films 127. Accordingly, there is a barrier at the interface between the microcrystalline silicon film 129 and the pair of amorphous silicon carbide films 127. The barrier affects the on-state current and field-effect mobility of the thin film transistor. On the other hand, the pair of microcrystalline silicon films 137 including carbon are formed between the microcrystalline silicon film 129 and the pair of amorphous silicon carbide films 127, whereby the barrier can be reduced, and the on-state current and field-effect mobility of the thin film transistor can be further increased.

The thin film transistor described in this embodiment has the pair of microcrystalline silicon films 137 including carbon between the microcrystalline silicon film 129 and the pair of amorphous silicon carbide films 127, whereby the on-state current and field-effect mobility of the thin film transistor can be further increased.

Embodiment 3

In this embodiment, a thin film transistor whose structure is different from those of Embodiment 1 and Embodiment 2 is described with reference to FIGS. 3A to 3C.

Figure 3A:
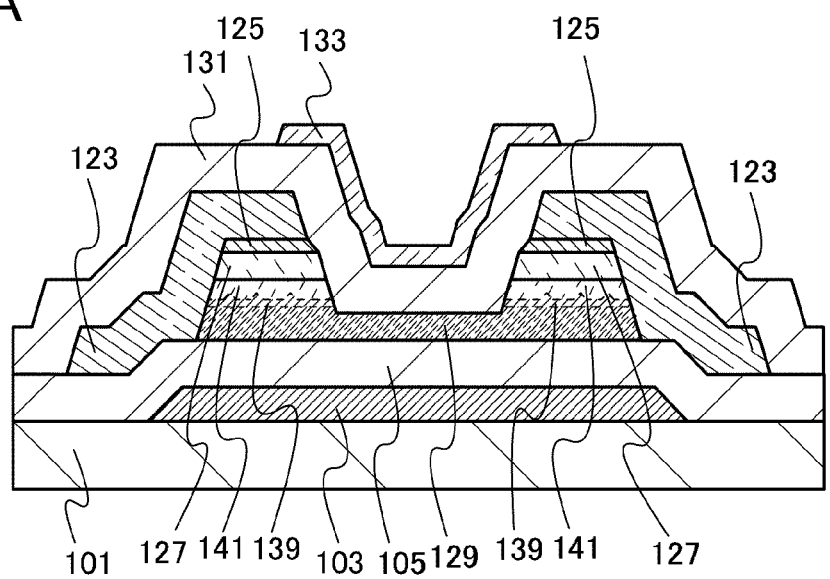
FIGS. 3A to 3C are cross-sectional views illustrating a semiconductor device according to one embodiment of the present invention.

The thin film transistor illustrated in FIG. 3A has a gate electrode 103, a microcrystalline silicon film 129, a gate insulating film 105 between the gate electrode 103 and the microcrystalline silicon film 129, a pair of microcrystalline silicon films 139 including nitrogen in contact with the microcrystalline silicon film 129, a pair of amorphous silicon films 141 including nitrogen in contact with the pair of microcrystalline silicon films 139 including nitrogen, a pair of amorphous silicon carbide films 127 in contact with the pair of amorphous silicon films 141 including nitrogen, impurity semiconductor films 125 serving as a source region and a drain region that are in contact with the pair of amorphous silicon carbide films 127, and wirings 123 in contact with the impurity semiconductor films 125 over a substrate 101. Further, an insulating film 131 covering the microcrystalline silicon film 129, the pair of microcrystalline silicon films 139 including nitrogen, the pair of amorphous silicon films 141 including nitrogen, the pair of amorphous silicon carbide films 127, the pair of impurity semiconductor films 125, and the wirings 123 may be provided. Furthermore, a back-gate electrode 133 overlapping with at least a gate electrode 103 and the microcrystalline silicon film 129 may be provided over the insulating film 131.

Figure 3B:
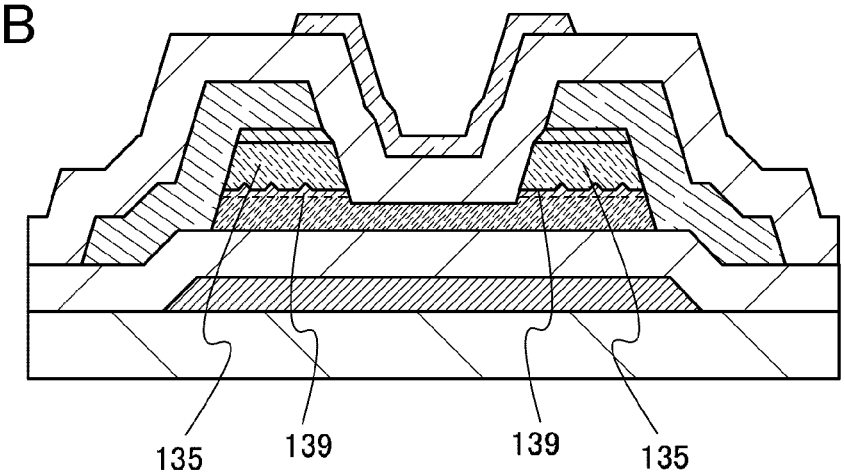

The thin film transistor illustrated in FIG. 3B is different from the thin film transistor illustrated in FIG. 3A in that a pair of microcrystalline silicon carbide films 135 which are in contact with the pair of microcrystalline silicon films 139 including nitrogen are provided instead of the pair of amorphous silicon films 141 including nitrogen and the pair of amorphous silicon carbide films 127. The pair of microcrystalline silicon carbide films 135 can have a crystal structure by growing a crystal using the pair of microcrystalline silicon films 139 including nitrogen as a seed crystal.

Figure 3C:
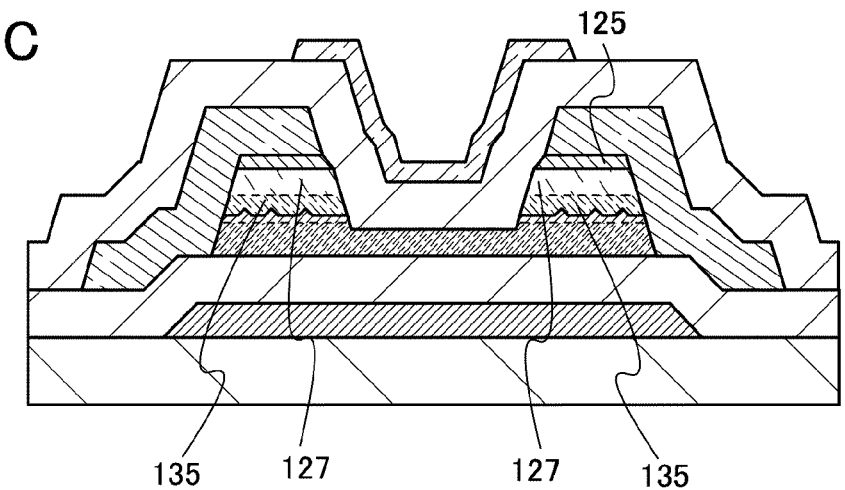

The thin film transistor illustrated in FIG. 3C is different from the thin film transistor illustrated in FIG. 3B in that the pair of amorphous silicon carbide films 127 are provided between the pair of microcrystalline silicon carbide films 135 and the impurity semiconductor films 125.

Figure 8A:
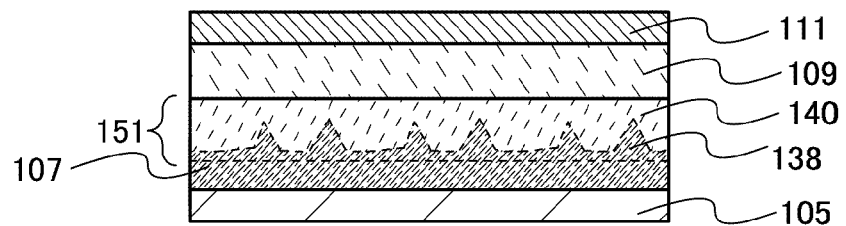
FIGS. 8A and 8B are cross-sectional views illustrating a method for manufacturing a semiconductor device according to one embodiment of the present invention.
Figure 8B:
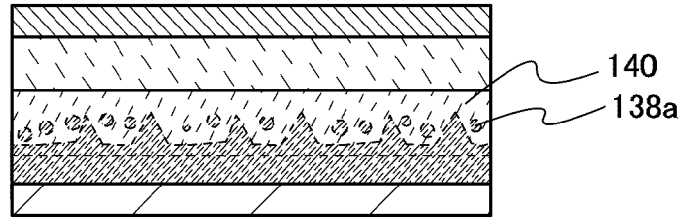

The details of the microcrystalline silicon films 139 including nitrogen and the amorphous silicon films 141 including nitrogen are described in Embodiment 6 with reference to FIGS. 8A and 8B.

The pair of amorphous silicon films 141 including nitrogen or the pair of microcrystalline silicon films 139 including nitrogen are provided between the microcrystalline silicon film 129 and the pair of amorphous silicon carbide films 127 or the pair of microcrystalline silicon carbide films 135, whereby the barrier between the microcrystalline silicon film 129 and the pair of amorphous silicon carbide films 127 or the pair of microcrystalline silicon carbide films 135 can be reduced, and the on-state current and field-effect mobility of the thin film transistor can be increased.

The crystal growth of the pair of microcrystalline silicon films 139 including nitrogen and the pair of amorphous silicon films 141 including nitrogen is suppressed at a later stage of deposition of the microcrystalline silicon film, by introduction of a gas including nitrogen into a process chamber. As a result, the pair of microcrystalline silicon films 139 including nitrogen and the pair of amorphous silicon films 141 including nitrogen are formed.

Further, a pair of microcrystalline silicon films including nitrogen and carbon may be formed instead of the pair of microcrystalline silicon films 139 including nitrogen. Furthermore, a pair of amorphous silicon films including nitrogen and carbon may be formed instead of the pair of amorphous silicon films 141 including nitrogen.

The amounts of nitrogen and carbon in the microcrystalline silicon films including nitrogen and carbon and the amounts of nitrogen and carbon in the amorphous silicon films including nitrogen and carbon are smaller than the stoichiometric proportion of silicon carbide. The amorphous silicon films including nitrogen and carbon and the microcrystalline silicon films including nitrogen and carbon are formed between the microcrystalline silicon film 129 and the amorphous silicon carbide films 127 or the microcrystalline silicon carbide films 135, whereby the barrier between the microcrystalline silicon film 129 and the pair of amorphous silicon carbide films 127 or the pair of microcrystalline silicon carbide films 135 can be reduced, and the on-state current and field-effect mobility of the thin film transistor can be increased.

Embodiment 4

In this embodiment, a thin film transistor whose off-state current is lower than those of the thin film transistors described in Embodiments 1 to 3 is described with reference to FIG. 4. In this embodiment, description is made using Embodiment 1; however, this embodiment can also be applied to Embodiments 2 and 3 as appropriate.

Figure 4:
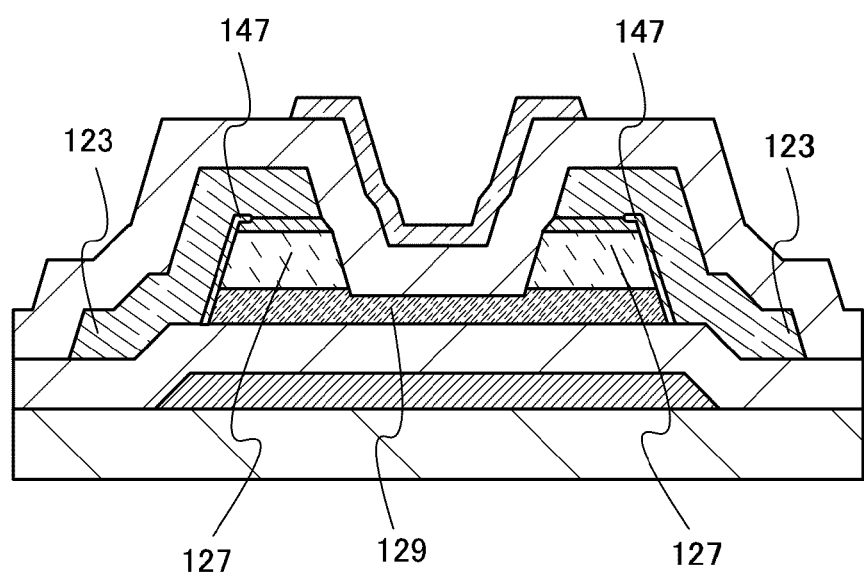
FIG. 4 is a cross-sectional view illustrating a semiconductor device according to one embodiment of the present invention.

As illustrated in FIG. 4, the thin film transistor described in this embodiment has insulating regions 147 serving as barrier regions between the microcrystalline silicon film 129 and the pair of amorphous silicon carbide films 127, and the wirings 123.

The insulating regions 147 serving as barrier regions are formed by nitriding or oxidizing part of the microcrystalline silicon film 129 and the pair of amorphous silicon carbide films 127, and are typically formed using semiconductor nitride or semiconductor oxide. Examples of the semiconductor nitride include silicon nitride, silicon nitride oxide, silicon carbide nitride, silicon carbide nitride oxide, and the like. Examples of the semiconductor oxide include silicon oxide, silicon oxynitride, silicon carbide oxide, silicon carbide oxynitride, and the like. Note that semiconductor nitride or semiconductor oxide included in the insulating regions 147 does not necessarily satisfy the stoichiometric proportion.

Note that, in FIG. 4, the insulating regions 147 serving as barrier regions are formed on the side walls of the microcrystalline silicon film 129 and the pair of amorphous silicon carbide films 127 and part of the surface of the impurity semiconductor films 125; however, the insulating regions 147 may be formed only on the side walls of the microcrystalline silicon film 129 and the pair of amorphous silicon carbide films 127.

The thin film transistor described in this embodiment has the insulating regions serving as barrier regions between the microcrystalline silicon film and the pair of silicon carbide films, and the wirings, whereby injection of holes from the wirings to the microcrystalline silicon film and the pair of silicon carbide films can be reduced. Accordingly, the off-state current of the thin film transistor can be reduced.

Embodiment 5

In this embodiment, a method for manufacturing the thin film transistors described in Embodiments 1 and 2 is described with reference to FIGS. 5A to 5C and FIGS. 6A and 6B. In this embodiment, a method for manufacturing the thin film transistor shown in FIG. 1A is described; however, this embodiment can also be applied to other thin film transistors described in Embodiments 1 and 2 as appropriate.

Figure 5A:
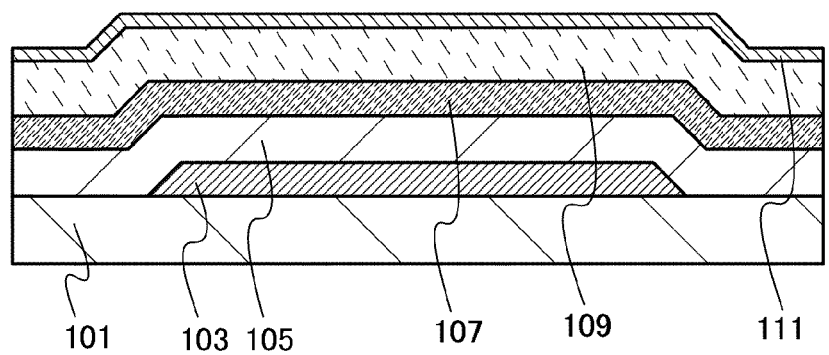
FIGS. 5A to 5C are cross-sectional views illustrating a method for manufacturing a semiconductor device according to one embodiment of the present invention.
Figure 5B:
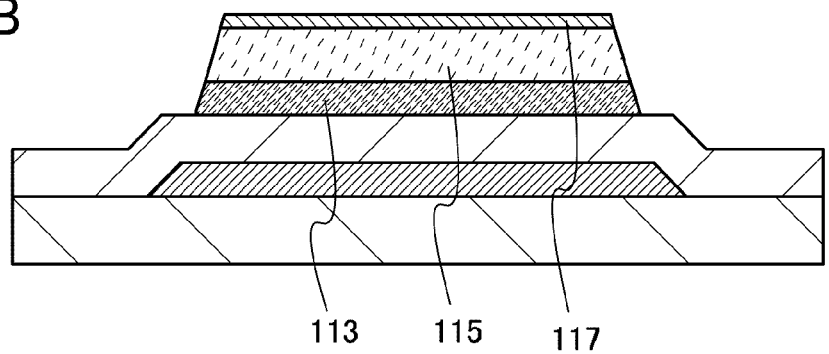

As illustrated in FIG. 5A, the gate electrode 103 is formed over the substrate 101. Next, the gate insulating film 105 covering the gate electrode 103 is formed; a microcrystalline silicon film 107 is formed over the gate insulating film 105; an amorphous silicon carbide film 109 is formed over the microcrystalline silicon film 107; and an impurity semiconductor film 111 is formed over the amorphous silicon carbide film 109.

As the substrate 101, the substrate 101 described in Embodiment 1 can be used as appropriate.

The gate electrode 103 can be formed in the following manner: a conductive film is formed over the substrate 101 by a sputtering method or a vacuum evaporation method using the above-described material(s); a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate with an inkjet method and baking the conductive nanopaste. In order to improve adhesion between the gate electrode 103 and the substrate 101, a nitride film of any of the above-described metal materials may be provided between the substrate 101 and the gate electrode 103. In this embodiment, a conductive film is formed over the substrate 101 and etched using a mask made of a resist formed by a photolithography method.

Note that side surfaces of the gate electrode 103 are preferably tapered. This is because an insulating film, a silicon film, and a wiring formed over the gate electrode 103 can be prevented from being cut in a step of the gate electrode 103. In order to taper the side surfaces of the gate electrode 103, etching may be performed while the resist mask is made to recede.

Through the step of forming the gate electrode 103, a gate wiring (a scan line) and a capacitor wiring can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode 103 and either or both a gate wiring and a capacitor wiring may be formed separately.

The gate insulating film 105 can be formed by a CVD method, a sputtering method, or the like. In a step of forming the gate insulating film 105 by a CVD method, glow discharge plasma is generated by applying high-frequency power in the HF band with a frequency of 3 MHz to 30 MHz, typically 13.56 MHz or 27.12 MHz, or high-frequency power in the VHF band with a frequency greater than 30 MHz and less than or equal to about 300 MHz, typically 60 MHz. When the gate insulating film 105 is formed using a microwave plasma CVD apparatus with the frequency of 1 GHz or more, the dielectric strength between the gate electrode and a drain and source electrodes of the thin film transistor can be improved, so that a highly reliable thin film transistor can be obtained. Note that a pulsed oscillation by which high-frequency power is applied in a pulsed manner or a continuous oscillation by which high-frequency power is applied continuously may be applied. In addition, by superimposing high-frequency power in the HF band and high-frequency power in the VHF band on each other, unevenness of plasma in a large-sized substrate is also reduced, so that uniformity can be improved and the deposition rate can be increased.

Further, by forming a silicon oxide film by a CVD method using an organosilane gas as the gate insulating film 105, the crystallinity of the semiconductor film which is formed later can be improved, so that the on-state current and the field-effect mobility of the thin film transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

In a reaction chamber of the plasma CVD apparatus, the microcrystalline silicon film 107 is formed by glow discharge plasma with the use of a mixed gas which includes hydrogen and a deposition gas containing silicon. Alternatively, the microcrystalline silicon film 107 is formed by glow discharge plasma with a mixture of a deposition gas containing silicon, hydrogen, and a rare gas such as helium, neon, or krypton. Here, the microcrystalline silicon film is formed under the condition in which the flow rate of hydrogen is 10 to 2000 times, preferably 10 to 200 times that of the deposition gas containing silicon. Alternatively, when the deposition gas containing germanium is used instead of the deposition gas containing silicon, a microcrystalline germanium film can be formed. Further, when the deposition gas containing silicon and the deposition gas containing germanium are used, a microcrystalline silicon germanium film can be formed. The deposition temperature in that case is preferably higher than or equal to 150° C. and lower than or equal to 300° C., more preferably higher than or equal to 150° C. and lower than or equal to 280° C. The pressure in the process chamber and a distance between an upper electrode and a lower electrode may have a value with which plasma can be generated.

As typical examples of the deposition gas including silicon, there are $SiH_4$, $Si_2H_6$, and the like. As typical examples of the deposition gas including germanium, there are $GeH_4$, $Ge_2H_6$, and the like.

A rare gas such as helium, argon, neon, krypton, or xenon is used as a source gas for the microcrystalline silicon film 107, whereby the deposition rate of the microcrystalline silicon film 107 can be increased. Moreover, since the deposition rate is increased, the amount of impurities which enter the microcrystalline silicon film 107 is reduced; thus, the crystallinity of the microcrystalline silicon film 107 can be improved.

When the microcrystalline silicon film 107 is formed, glow discharge plasma can be generated in a manner similar to that of the gate insulating film 105.

Before the microcrystalline silicon film 107 is formed, impurity elements in the process chamber of the CVD apparatus may be removed by evacuation of the process chamber and introduction of the deposition gas containing silicon, so that the amount of impurity in the microcrystalline silicon film 107 can be reduced. Before the microcrystalline silicon film 107 is formed, plasma may be generated in an atmosphere containing fluorine, such as a fluorine atmosphere, a nitrogen fluoride atmosphere, or a silane fluoride atmosphere, and the gate insulating film 105 may be exposed to fluorine plasma.

When the gate insulating film 105 is formed using a silicon nitride film, at an early stage of deposition of the microcrystalline silicon film 107, amorphous silicon is easily formed and the crystallinity of the microcrystalline silicon film 107 is low. Therefore, the microcrystalline silicon film 107 is preferably formed under a condition that the dilution rate of the deposition gas containing silicon is high or under a low temperature condition that the deposition temperature is higher than or equal to 150° C. and lower than or equal to 250° C. Typically, the high dilution rate condition that the flow rate of hydrogen is 200 to 2000 times, preferably 250 to 400 times that of the deposition gas containing silicon is preferable. Further, the low temperature condition is preferable in which the deposition temperature of the amorphous silicon carbide film 109 is higher than or equal to 200° C. and lower than or equal to 250° C. When the high dilution rate condition or the low temperature condition is employed, initial nucleation density is increased, amorphous silicon over the gate insulating film 105 is not easily formed, and the crystallinity of the microcrystalline silicon film 107 is improved. Further, the surface of the gate insulating film 105 formed using the silicon nitride film may be oxidized, so that the adhesion with the microcrystalline silicon film 107 is improved. As the oxidation treatment, exposure to an oxidizing gas, plasma treatment in an oxidation gas atmosphere, or the like can be used. Examples of the oxidation gas include oxygen, ozone, dinitrogen monoxide, water vapor, a mixed gas of oxygen and hydrogen, and the like.

In a reaction chamber of the plasma CVD apparatus, the amorphous silicon carbide film 109 is formed by glow discharge plasma using a mixture of a deposition gas containing silicon and a gas containing carbon. Alternatively, in the reaction chamber of the plasma CVD apparatus, the microcrystalline silicon carbide film 109 is formed by glow discharge plasma using a mixture of organosilane and hydrogen. Note that the amorphous silicon carbide film 109 can be formed by a thermal CVD method, a photo CVD method utilizing light, or the like instead of a plasma CVD method. By appropriate adjustment of the deposition condition, the microcrystalline silicon carbide film can be formed.

As the gas containing carbon, hydrocarbon, alkyl halide, organosilane, or the like can be used.

As typical examples of hydrocarbon, saturated hydrocarbon such as methane ($CH_4$), ethane ($C_2H_6$), propane ($C_3H_8$), or butane ($C_4H_{10}$), unsaturated hydrocarbon such as ethylene ($C_2H_4$), propylene ($C_3H_6$), acetylene ($C_2H_2$), and the like can be used; however, this embodiment is not limited thereto. In particular, methane ($CH_4$), propane ($C_3H_8$), or acetylene ($C_2H_2$) is preferable.

As typical examples of alkyl halide, methyl chloride ($CH_3Cl$), carbon tetrachloride ($CCl_4$), and the like can be used; however, this embodiment is not limited thereto.

As typical examples of organosilane, there is no particular limitation as long as organosilane has a molecular structure in which hydrocarbon functional group is bonded to silicon, for example, monomethylsilane ($SiH_3CH_3$:MMS), dimethylsilane ($SiH_2(CH_3)_2$:DMS), tetramethylsilane ($Si(CH_3)_4$: TMS), tetraethylsilane ($Si(C_2H_5)_4$:TES), hexamethyldisilane ($Si_2(CH_3)_6$:HMDS), and the like are preferably used. Further, a material having a molecular structure in which another functional group is bonded to the above organosilane, for example, tetraethoxysilane ($Si(OC_2H_5)_4$:TEOS), methyltrichlorosilane (($CH_3)SiCl_3$), hexamethyldisilazane ($HN(Si(CH_3)_3)_2$), or the like may be used.

The impurity semiconductor film 111 is formed by glow discharge plasma with the use of a mixture of hydrogen, phosphine (diluted with hydrogen or silane), and a deposition gas containing silicon in the reaction chamber of the plasma CVD apparatus. Amorphous silicon to which phosphorus is added or microcrystalline silicon to which phosphorus is added is formed by dilution of the deposition gas containing silicon with hydrogen. In the case where a p-channel thin film transistor is formed, the impurity semiconductor film 111 may be formed by glow discharge plasma using diborane instead of phosphine.

Next, a resist mask is formed over the impurity semiconductor film 111 through a photolithography process.

After that, the microcrystalline silicon film 107, the amorphous silicon carbide film 109, and the impurity semiconductor film 111 are etched using the resist mask. In this manner, the microcrystalline silicon film 107, the amorphous silicon carbide film 109, and the impurity semiconductor film 111 are separated for each element, and a microcrystalline silicon film 113, an amorphous silicon carbide film 115, and an impurity semiconductor film 117 are formed. After that, the resist mask is removed (see FIG. 5B).

Figure 5C:
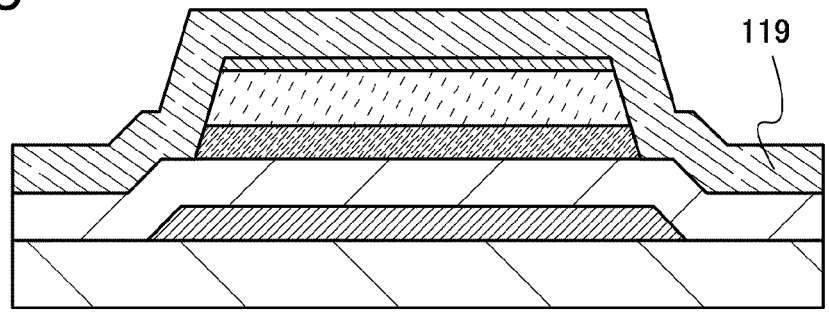

Next, a conductive film 119 is formed over the impurity semiconductor film 117 (see FIG. 5C). The conductive film 119 is formed by a CVD method, a sputtering method, or a vacuum evaporation method. Alternatively, the conductive film 119 may be formed by discharge of a conductive nanopaste of silver, gold, copper, or the like by a screen printing method, an ink-jet method, or the like and baking of the conductive nanopaste. The conductive film 119 can be formed using a material which is similar to that of the wirings 123 described in Embodiment 1 as appropriate.

Next, a resist mask is formed through photolithography process, and the conductive film 119 is etched using the resist mask to form the wirings 123 serving as a source electrode and a drain electrode. The etching of the conductive film 119 can be dry etching or wet etching. Note that one of the wirings 123 serves not only as a source or drain electrodes but also as a signal line. However, without limitation thereto, a signal line may be provided separately from the source and drain electrodes.

Next, the impurity semiconductor film 117 and the amorphous silicon carbide film 115 are partly etched, so that a pair of impurity semiconductor films 125 serving as a source and drain regions and a pair of amorphous silicon carbide films 127 are formed. By the etching, a microcrystalline silicon film 129 whose exposed portion of a surface is formed to have a recessed shape. At this time, the etching is performed so that the microcrystalline silicon film 129 is exposed, whereby the microcrystalline silicon film 129 and the amorphous silicon carbide films 127 are stacked in regions which are covered with the wirings 123, and the microcrystalline silicon film 129 is exposed in a region which is not covered with the wirings 123 but overlaps with the gate electrode 103. That is, the microcrystalline silicon film 129 is exposed in a back channel. The back channel is a region in the microcrystalline silicon film 129, which does not overlap with the source and drain regions and is provided on the side where an insulating film 131 is formed later. Specifically, the back channel refers to a region of the microcrystalline silicon film 129, which is near a region which is in contact with the insulating film 131.

Since dry etching is used in the etching here, ends of the wirings 123 are aligned with ends of the impurity semiconductor films 125. If the conductive film 119 is subjected to wet etching and the impurity semiconductor film 117 is subjected to dry etching, the ends of the wirings 123 and the ends of the impurity semiconductor films 125 are not aligned with each other. In a cross section in such a case, the ends of the wirings 123 are positioned on the inner side than the ends of the impurity semiconductor films 125.

Next, dry etching may be performed. The dry etching is performed under conditions that no damage is given to the microcrystalline silicon film 129 and an etching rate of the microcrystalline silicon film 129 is low. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Next, the surface of the microcrystalline silicon film 129 is subjected to plasma treatment typified by water plasma treatment, oxygen plasma treatment, ammonia plasma treatment, nitrogen plasma treatment, or the like.

The water plasma treatment can be performed by generating plasma using a gas containing water as its main component, typified by water vapor, which is introduced into the reaction space. After that, the resist mask is removed (see FIG. 6A). Note that the resist mask may be removed before the dry etching of the impurity semiconductor films 125 and the amorphous silicon carbide film 115.

After the microcrystalline silicon film 129 is formed, the dry etching is further performed under the condition that no damage is given to the microcrystalline silicon film 129, whereby an impurity such as a residue existing on the exposed part of microcrystalline silicon film 129 can be removed. By the plasma treatment, insulation between the source region and the drain region can be ensured, and thus, in a thin film transistor which is completed, off-state current can be reduced, and variation in electric characteristics can be reduced. Further, the water plasma treatment follows the dry etching to be performed, whereby a residue of the resist mask can be removed and a defect of the microcrystalline silicon film 129 can be reduced.

Note that the resist mask is removed after the wirings 123 are formed by etching the conductive film 119 with the use of the resist mask and the amorphous silicon carbide film 115 is partly etched. Then, parts of the amorphous silicon carbide film 115 and the microcrystalline silicon film 113 are etched using the wirings 123 as masks, so that the microcrystalline silicon film 129 can be exposed. Through this process, the microcrystalline silicon film 129 is prevented from being in contact with a resist stripper and a residue of the resist. Further, since the amorphous silicon carbide film 115 is etched using the wirings 123 to expose the microcrystalline silicon film 129 after the resist mask is removed, the amorphous silicon carbide film 115 which is in contact with the resist stripper and a residue of the resist is not left in the back channel. Consequently, leakage current due to the resist stripper and a residue of a resist left in a back channel is not generated, which can further reduce the off-state current of the thin film transistor.

Through the above-described process, a single-gate thin film transistor can be formed.

Next, an insulating film 131 (also referred to as a second gate insulating film) is formed. The insulating film 131 can be formed in a manner similar to that of the gate insulating film 105.

Next, an opening (not shown) is formed in the insulating film 131 with the use of a resist mask formed through a photolithography step. Next, a back-gate electrode 133 (also referred to as a second gate electrode) is formed (see FIG. 6B). Through the above steps, a dual-gate thin film transistor can be formed.

The back-gate electrode 133 can be formed in a manner similar to that of the wirings 123. Further, the back-gate electrode 133 can be formed using a light-transmitting conductive material such as indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added.

Alternatively, the back-gate electrode 133 can be formed using a conductive composition containing a light-transmitting conductive high molecule (also referred to as a conductive polymer). The back-gate electrode 133 preferably has a sheet resistance of less than or equal to 10000 $\Omega$/sq. and a light transmittance of greater than or equal to 70% at a wavelength of 550 nm. Further, the resistivity of the conductive high molecule included in the conductive composition is preferably less than or equal to 0.1 $\Omega \cdot cm$.

As the conductive macromolecule, a so-called $\pi$-electron conjugated conductive macromolecule can be used. For example, polyaniline and/or a derivative thereof, polypyrrole and/or a derivative thereof, polythiophene and/or a derivative thereof, and a copolymer of two or more of aniline, pyrrole, and thiophene and/or a derivative thereof can be given.

The back-gate electrode 133 can be formed in the following manner: a thin film is formed using the material described above by a sputtering method; and the thin film is etched using a resist mask that is formed by a photolithography step. Alternatively, a conductive composition including a conductive high molecule having a light-transmitting property is applied or printed, and baked to form the back-gate electrode 133.

Next, forms of the back-gate electrode 133 are described with reference to FIGS. 16A to 16D that are plan views of the thin film transistors.

Figure 16A:
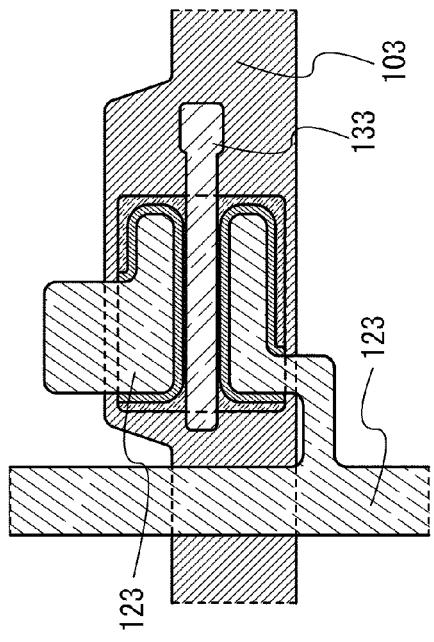
FIGS. 16A to 16D are plan views illustrating methods for manufacturing semiconductor devices according to one embodiment of the present invention.

As illustrated in FIG. 16A, the back-gate electrode 133 can be formed in parallel to the gate electrode 103. In this case, the potential applied to the back-gate electrode 133 and the potential applied to the gate electrode 103 can be separately controlled as appropriate. Thus, the threshold voltage of the thin film transistor can be controlled. Further, regions in which carriers flow, that is, channel regions, are formed on the gate insulating film 105 side and on the insulating film 131 side in the microcrystalline silicon film 129; thus, the on-state current of the thin film transistor can be increased.

Figure 16C:
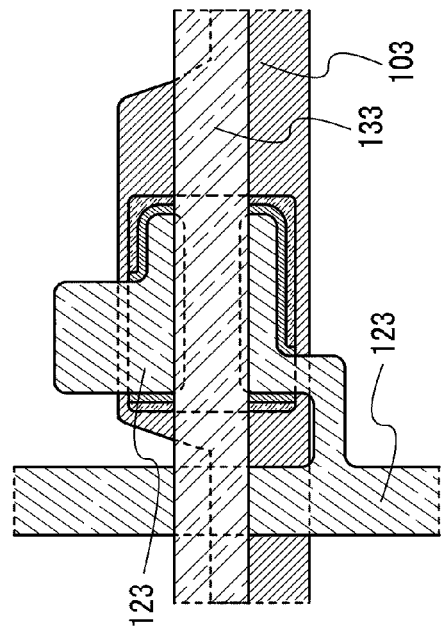
Figure 16B:
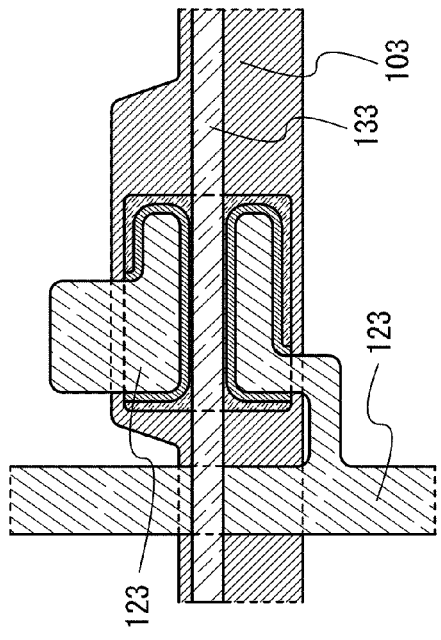

As illustrated in FIG. 16B, the back-gate electrode 133 can be connected to the gate electrode 103. That is, the gate electrode 103 and the back-gate electrode 133 can be connected through an opening 150 formed in the gate insulating film 105 and the insulating film 131. In this case, the potential applied to the back-gate electrode 133 and the potential applied to the gate electrode 103 are equal. As a result, regions in which carriers flow, that is, channel regions, are formed on the gate insulating film 105 side and on the insulating film 131 side in the microcrystalline silicon film 129; thus, the on-state current of the thin film transistor can be increased.

Further alternatively, as illustrated in FIG. 16C, the back-gate electrode 133 is not necessarily connected to the gate electrode 103 but may be in a floating state. In that case, channel regions are formed on the gate insulating film 105 side and on the insulating film 131 side in the microcrystalline silicon film 129 without applying potential to the back-gate electrode 133; thus, the on-state current of the thin film transistor can be increased.

Figure 16D:
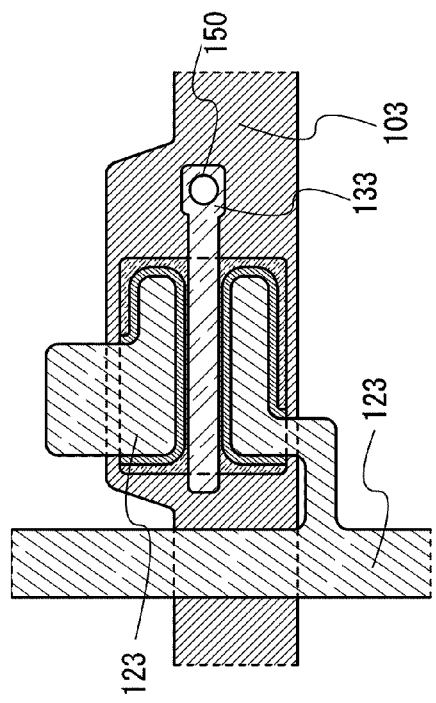

Further, as illustrated in FIG. 16D, the back-gate electrode 133 may overlap with the wirings 123 with the insulating film 131 provided therebetween. Although FIG. 16D illustrates the case using the back-gate electrode 133 illustrated in FIG. 16A, the back-gate electrode 133 of FIG. 16B or FIG. 16C may also be made to overlap with the wirings 123.

Through the above steps, as illustrated in FIG. 1A, the thin film transistor having high on-state current, high field-effect mobility, and low off-state current, can be manufactured.

Embodiment 6

In this embodiment, a method for manufacturing the thin film transistor described in Embodiment 3 is with reference to FIGS. 7A to 7C, FIGS. 8A and 8B, and FIGS. 9A and 9B.

Figure 7A:
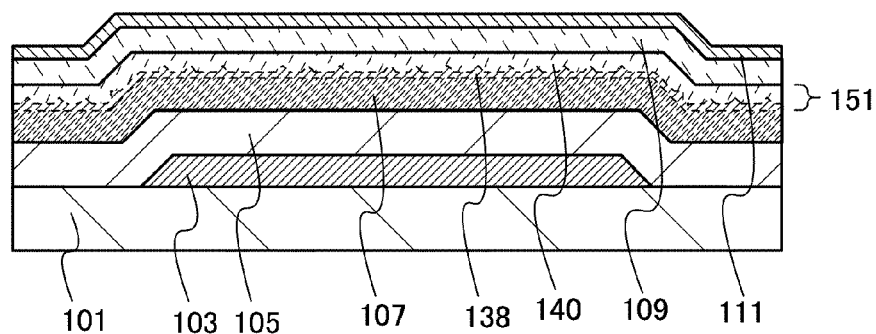
FIGS. 7A to 7C are cross-sectional views illustrating a method for manufacturing a semiconductor device according to one embodiment of the present invention.
Figure 7B:
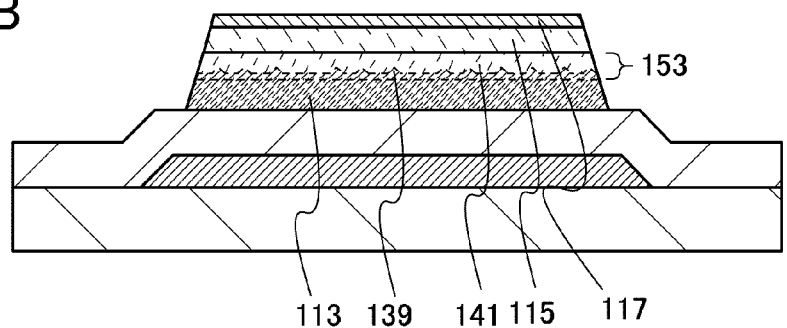

As in Embodiment 5, as illustrated in FIG. 7A, a gate electrode 103 is formed over a substrate 101. Next, a gate insulating film 105 which covers the gate electrode 103 is formed, and a microcrystalline silicon film 107 is formed over the gate insulating film 105. Then, a silicon film 151 including nitrogen is formed over the microcrystalline silicon film 107. After that, an amorphous silicon carbide film 109 is formed over the silicon film 151 including nitrogen and an impurity semiconductor film 111 is formed over the amorphous silicon carbide film 109. The microcrystalline silicon film 107, the amorphous silicon carbide film 109, and the impurity semiconductor film 111 can be formed as in Embodiment 5.

The silicon film 151 including nitrogen includes a microcrystalline silicon film 138 including nitrogen and an amorphous silicon film 140 including nitrogen. The microcrystalline silicon film 138 including nitrogen and the amorphous silicon film 140 including nitrogen can be formed under a condition that crystal growth is partly conducted (the crystal growth is partly suppressed) with the use of the microcrystalline silicon film 107 as a seed crystal.

In a process chamber of a plasma CVD apparatus, a deposition gas containing silicon is mixed with hydrogen and a gas containing nitrogen, and the silicon film 151 including nitrogen is formed by glow discharge plasma. Examples of the gas containing nitrogen include ammonia, nitrogen, nitrogen fluoride, nitrogen chloride, chloroamine, fluoroamine, and the like. Glow discharge plasma can be generated as in the case of the microcrystalline silicon film 107.

In this case, the flow ratio of the deposition gas containing silicon to hydrogen is the same as that for forming the microcrystalline silicon film 107, and a gas containing nitrogen is used as the source gas, whereby crystal growth can be suppressed as compared to the deposition condition of the microcrystalline silicon film 107. Specifically, at an early stage of deposition of the silicon film 151 including nitrogen, the gas containing nitrogen included in the source gas partly suppresses the crystal growth, so that conical or pyramidal microcrystalline silicon including nitrogen grows and amorphous silicon including nitrogen is formed. Further, at a middle stage or a later stage of the deposition, crystal growth in conical or pyramidal microcrystalline silicon including nitrogen stops, and only amorphous silicon including nitrogen is deposited. Accordingly, in the silicon film 151 including nitrogen, the microcrystalline silicon film 138 including nitrogen and the amorphous silicon film 140 which is formed using a well-ordered semiconductor film having fewer defects and a steep tail of a level at a band edge in the valence edge, can be formed.

Here, a typical example of a condition for forming the silicon film 151 including nitrogen is as follows: the flow rate of hydrogen is 10 to 2000 times, preferably 10 to 200 times that of the deposition gas containing silicon. Note that in a typical example of a condition for forming a normal amorphous silicon film, the flow rate of hydrogen is 0 to 5 times that of the deposition gas containing silicon.

A rare gas such as helium, neon, argon, krypton, or xenon is introduced into the source gas of the silicon film 151 including nitrogen, whereby the deposition rate can be increased.

Furthermore, with the use of a deposition gas including carbon in addition to the deposition gas including silicon and a gas including nitrogen, a microcrystalline silicon film including carbon and nitrogen and an amorphous silicon film including carbon and nitrogen can be formed.

It is preferable for the silicon film 151 including nitrogen to have a thickness of 50 nm to 350 nm, and still preferable for the silicon film 151 including nitrogen to have a thickness of 120 nm to 250 nm.

FIGS. 8A and 8B are enlarged views of portions between the gate insulating film 105 and the impurity semiconductor film 111 shown in FIG. 7A.

As shown in FIG. 8A, the microcrystalline silicon film 138 including nitrogen in the silicon film 151 including nitrogen has projections and depressions; the microcrystalline silicon film 138 including nitrogen has a projecting (conical or pyramidal) shape whose tip is narrowed from the gate insulating film 105 side toward the amorphous silicon film 140 including nitrogen (the tip of the projection has an acute angle). Note that the microcrystalline silicon film 138 including nitrogen may have a projecting (inverted conical or pyramidal) shape whose width increases from the gate insulating film 105 side toward the amorphous silicon film 140 including nitrogen.

The thickness of the microcrystalline silicon film 138 including nitrogen, that is, the distance from an interface between the microcrystalline silicon film 138 including nitrogen and the gate insulating film 105 to the tip of the projection of the microcrystalline silicon film 138 including nitrogen is set to be greater than or equal to 5 nm and less than or equal to 310 nm, so that the off-state current of the thin film transistor can be reduced.

Since the crystallinity of the microcrystalline silicon film 138 including nitrogen can be improved, the concentrations of oxygen and nitrogen contained in the silicon film 151 including nitrogen which are measured by secondary ion mass spectrometry are preferably set to be less than $1\times10^{18}$ atoms/cm$^3$.

Nitrogen contained in the microcrystalline silicon film 138 including nitrogen and the amorphous silicon film 140 including nitrogen may exist, for example, as an NH group or an NH$_2$ group.

The nitrogen concentration profile of the amorphous silicon film including nitrogen has a peak concentration greater than or equal to $1\times10^{20}$ atoms/cm$^3$ and less than or equal to $1\times10^{21}$ atoms/cm$^3$, preferably greater than or equal to $2\times10^{20}$ atoms/cm$^3$ and less than or equal to $1\times10^{21}$ atoms/cm$^3$.

The amorphous silicon film 140 including nitrogen includes a semiconductor having a less amount of the defect absorption spectrum and lower energy at an Urbach edge, which is measured by a constant photocurrent method (CPM) or photoluminescence spectroscopy, as compared to conventional amorphous silicon. That is, as compared to conventional amorphous silicon, amorphous silicon including nitrogen includes a well-ordered semiconductor which has fewer defects and a steep tail of a level at a band edge in the valence band. Since amorphous silicon including nitrogen has a steep tail of a level at a band edge in the valence band, the band gap gets wider and tunnel current does not easily flow. Therefore, the amorphous silicon film including nitrogen is provided between the microcrystalline silicon film 138 including nitrogen and the amorphous silicon carbide film 109, whereby the off-state current of the thin film transistor can be reduced. In addition, by provision of the amorphous silicon film including nitrogen, the on-state current and the field-effect mobility can be increased.

Further, the peak region of a spectrum of the amorphous silicon film 140 including nitrogen that is obtained by low-temperature photoluminescence spectroscopy is greater than or equal to 1.31 eV and less than or equal to 1.39 eV. Note that the peak region of a spectrum of microcrystalline silicon that is obtained by low-temperature photoluminescence spectroscopy silicon is greater than or equal to 0.98 eV and less than or equal to 1.02 eV. Accordingly, amorphous silicon including nitrogen has different characteristics from those of microcrystalline silicon.

Further, as shown in FIG. 8B, a silicon crystal grain 138a whose grain diameter is greater than or equal to 1 nm and less than or equal to 10 nm, preferably greater than or equal to 1 nm and less than or equal to 5 nm may be included in the amorphous silicon film 140 including nitrogen, so that the on-state current and the filed-effect mobility can be further increased.

The microcrystalline silicon film 138 having a projected (conical or pyramidal) shape whose tip is narrowed from the gate insulating film 105 side toward the amorphous silicon film 140 including nitrogen or the microcrystalline silicon film 138 including nitrogen that has a projected shape whose width increases from the gate insulating film 105 side toward the amorphous silicon film 140 including nitrogen is formed in the following manner: after the microcrystalline silicon film 107 is formed, amorphous silicon is deposited under a condition that crystal growth is partly conducted (the crystal growth is partly suppressed).

Since the microcrystalline silicon film 138 including nitrogen in the silicon film 151 including nitrogen has the conical or pyramidal shape or the inverted conical or pyramidal shape, resistance in a vertical direction (film thickness direction) of when voltage is applied between a source and drain electrodes in an on state, i.e., the resistance of the silicon film 151 can be lowered. Further, tunnel current does not easily flow by provision of amorphous silicon including nitrogen between the microcrystalline silicon film 107 and the amorphous silicon carbide film 109. Amorphous silicon including nitrogen is a well-ordered semiconductor having fewer defects and a steep tail of a level at a band edge in the valence band. Thus, in the thin film transistor described in this embodiment, the on-state current and the field-effect mobility can be increased and the off-state current can be reduced.

Here, the microcrystalline silicon film 138 including nitrogen and the amorphous silicon film 140 including nitrogen are formed while the source gas of the silicon film 151 including nitrogen includes a gas containing nitrogen. As another method for forming the silicon film 151 including nitrogen, the following method can be employed: a surface of the microcrystalline silicon film 107 is exposed to a gas containing nitrogen so that nitrogen is adsorbed onto the surface of the microcrystalline silicon film 107; and then, the microcrystalline silicon film 138 including nitrogen and the amorphous silicon film 140 including nitrogen can be formed using a deposition gas containing silicon and using hydrogen as a source gas.

Next, a resist mask is formed over the impurity semiconductor film 111 through a photolithography process as in Embodiment 5.

After that, the microcrystalline silicon film 107, the silicon film 151 including nitrogen, the amorphous silicon carbide film 109, and the impurity semiconductor film 111 are etched using the resist mask. In this manner, the microcrystalline silicon film 107, the silicon film 151 including nitrogen, the amorphous silicon carbide film 109, and the impurity semiconductor film 111 are separated for each element, and a microcrystalline silicon film 113, a silicon film 153 including nitrogen, an amorphous silicon carbide film 115, and an impurity semiconductor film 117 are formed. Note that the silicon film 153 including nitrogen includes a microcrystalline silicon film 139 including nitrogen and an amorphous silicon film 141 including nitrogen. After that, the resist mask is removed (see FIG. 7B).

Figure 7C:
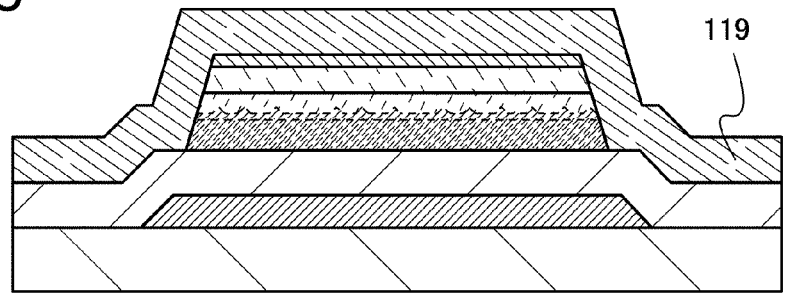

Next, a conductive film 119 is formed over the impurity semiconductor film 117 as in Embodiment 5 (see FIG. 7C).

Next, a resist mask is formed through a photolithography process, and the conductive film 119 is etched using the resist mask to form the wirings 123 serving as a source electrode and a drain electrode as in Embodiment 5. Next, the impurity semiconductor film 117 and the amorphous silicon carbide film 115 are partly etched, so that a pair of impurity semiconductor films 125 serving as a source and drain regions, a pair of amorphous silicon carbide films 127, a pair of amorphous silicon films 141 including nitrogen, the pair of microcrystalline silicon films 139 including nitrogen are formed. By the etching, a microcrystalline silicon film 129 whose exposed portion of a surface is formed to have a recessed shape (see FIG. 9A).

Next, dry etching and plasma treatment may be performed as in Embodiment 5.

Through the above-described process, a single-gate thin film transistor can be formed.

Figure 9A:
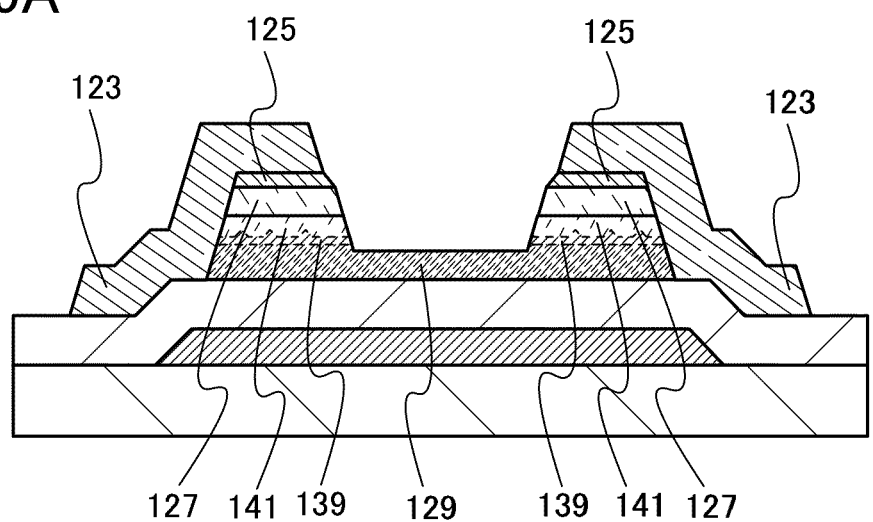
FIGS. 9A and 9B are cross-sectional views illustrating the method for manufacturing a semiconductor device according to one embodiment of the present invention.
Figure 9B:
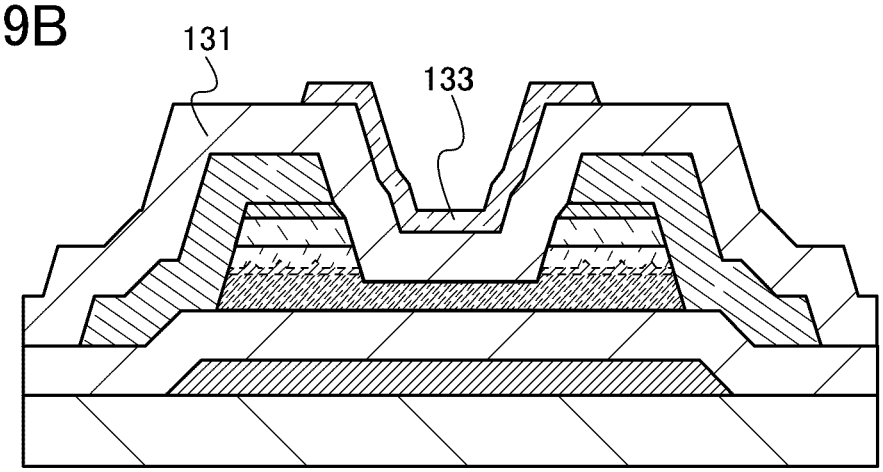

Next, as in Embodiment 5, the insulating film 131 and the back-gate electrode 133 are formed, so that a dual-gate thin film transistor can be formed (see FIG. 9B).

Through the above steps, as illustrated in FIG. 3A, the thin film transistor having high on-state current, high field-effect mobility, and low off-state current, can be formed.

Embodiment 7

In this embodiment, a method for manufacturing a thin film transistor whose off-state current is lower than that of the thin film transistors described in Embodiment 5 and Embodiment 6 is described with reference to FIGS. 5A to 5C and FIGS. 10A to 10C. Note that although description is made with reference to Embodiment 5 here, description in Embodiment 6 can be used as appropriate.

Figure 10A:
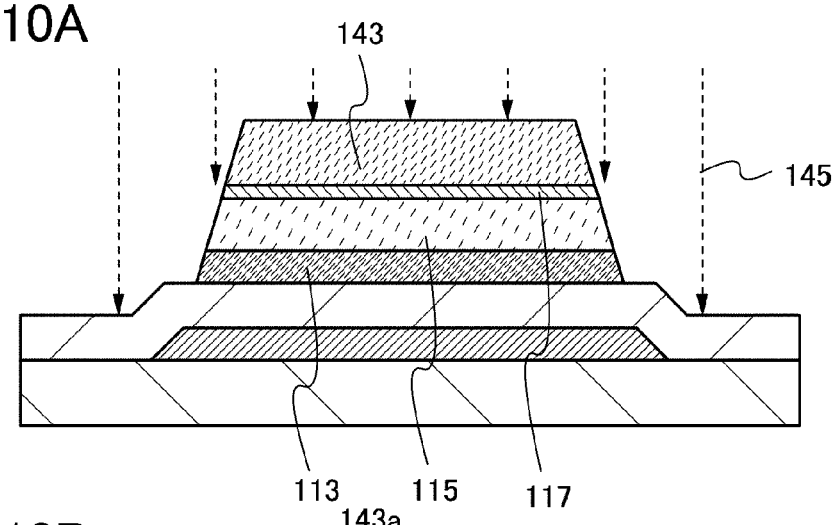
FIGS. 10A to 10C are cross-sectional views illustrating a method for manufacturing a semiconductor device according to one embodiment of the present invention.

As in Embodiment 5, after the process illustrated in FIG. 5A, as shown in FIG. 10A, a microcrystalline silicon film 107, an amorphous silicon carbide film 109, and an impurity semiconductor film 111 are etched to form a microcrystalline silicon film 113, an amorphous silicon carbide film 115, and an impurity semiconductor film 117.

Then, plasma treatment is performed in a state where a resist mask 143 is left so that side surfaces of the microcrystalline silicon film 113, the amorphous silicon carbide film 115, and the impurity semiconductor film 117 are exposed to plasma 145. Here, plasma is generated in an oxidation gas atmosphere or a nitriding gas atmosphere, and the microcrystalline silicon film 113, the amorphous silicon carbide film 115, and the impurity semiconductor film 117 are exposed to the plasma 145.

Examples of the oxidation gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. Generation of plasma in an oxidation gas or a nitriding gas causes an oxygen radical or a nitrogen radical to be generated. The radical reacts with the microcrystalline silicon film 113, the amorphous silicon carbide film 115 and the impurity semiconductor film 117, whereby insulating regions serving as barrier regions can be formed on the side surfaces of the microcrystalline silicon film 113, the amorphous silicon carbide film 115, and the impurity semiconductor film 117. Note that instead of irradiation with plasma, irradiation with ultraviolet light may be employed for generation of an oxygen radical or a nitrogen radical.

Figure 10B:
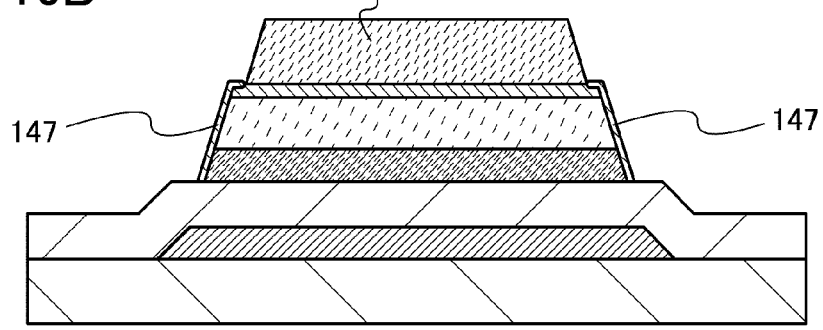

In the case of using oxygen, ozone, water vapor, or a mixed gas of oxygen and hydrogen as the oxidation gas, the resist recedes by plasma irradiation, so that a resist mask 143a whose top surface is smaller than that of the resist mask 143 is formed as shown in FIG. 10B. Therefore, by the plasma treatment, the exposed impurity semiconductor film 117 is oxidized together with the side walls of the microcrystalline silicon film 113 and the amorphous silicon carbide film 115, so that insulating regions 147 serving as barrier regions are formed on the side walls of the microcrystalline silicon film 113 and the amorphous silicon carbide film 115, and on the side wall and part of a top surface of the impurity semiconductor film 117.

Figure 6A:
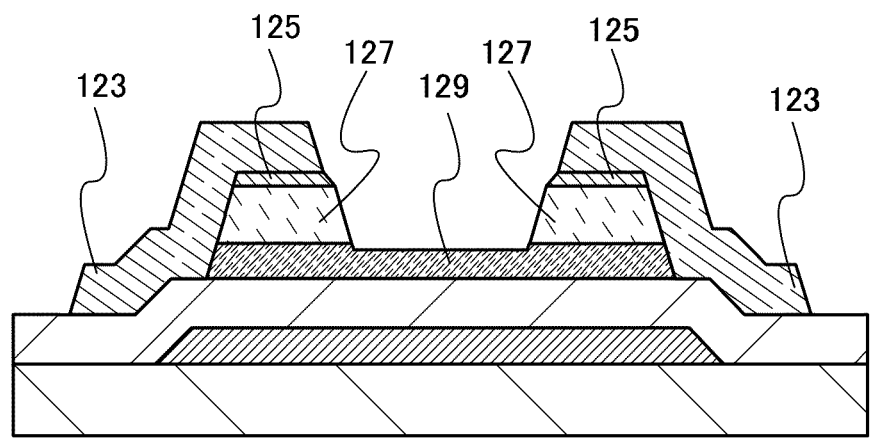
FIGS. 6A and 6B are cross-sectional views illustrating the method for manufacturing a semiconductor device according to one embodiment of the present invention.
Figure 6B:
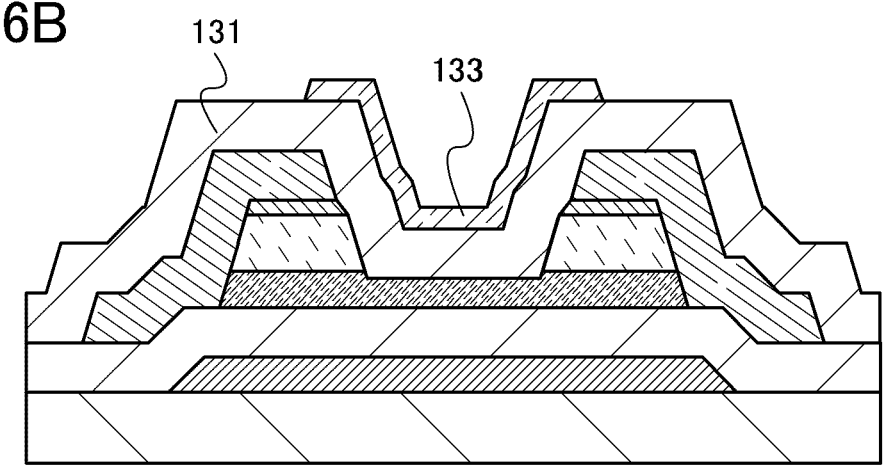

Next, as described in Embodiment 5, through processes illustrated in FIG. 5C and FIGS. 6A and 6B, the wirings 123 serving as a source and drain electrodes, the pair of impurity semiconductor films 125 serving as a source and drain regions, the pair of amorphous silicon carbide films 127 and the microcrystalline silicon film 129 are formed, whereby a single-gate thin film transistor can be formed.

Figure 10C:
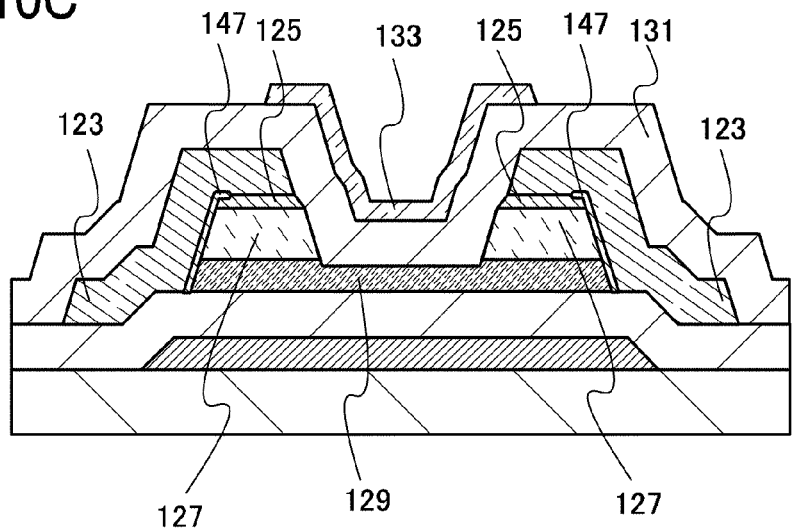

Next, as in Embodiment 5, the insulating film 131 and the back-gate electrode 133 are formed, so that a dual-gate thin film transistor can be formed (see FIG. 10C).

Since a thin film transistor described in this embodiment has insulating regions serving as barrier regions, injection of holes from the wirings 123 to the microcrystalline silicon film 113 and the amorphous silicon carbide films 127 can be reduced, so that the off-state current of the thin film transistor is reduced and the on-state current and the field-effect mobility of the TFT are increased. Therefore, the size of the thin film transistor can be decreased, and high integration of a semiconductor device can be achieved. Further, when the thin film transistor described in this embodiment is used for a driver circuit of a display device, the size of the driver circuit can be decreased, which enables the frame of the display device to be narrowed.

Embodiment 8

A thin film transistor is manufactured, and a semiconductor device having a display function (also referred to as a display device) can be manufactured using the thin film transistor in a pixel portion and further in a driver circuit. Further, when part or whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, a display device includes a panel in which a display element is sealed, and a module in which an IC including a controller or the like is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is provided, a state after a conductive film to be a pixel electrode is formed and before the pixel electrode is formed by etching the conductive film, or any other states.

Note that a display device in this specification means a display device, or a light source (including a lighting device). Further, the display device includes any of the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

Embodiment 9

A semiconductor device disclosed in this specification can be applied to electronic paper. An electronic paper can be used for electronic devices of a variety of fields as long as they can display data. For example, electronic paper can be applied to an electronic book (e-book), a poster, an advertisement in a vehicle such as a train, a digital signage, a public information display (PID), displays of various cards such as a credit card, and the like. An example of the electronic device is illustrated in FIG. 11.

Figure 11:
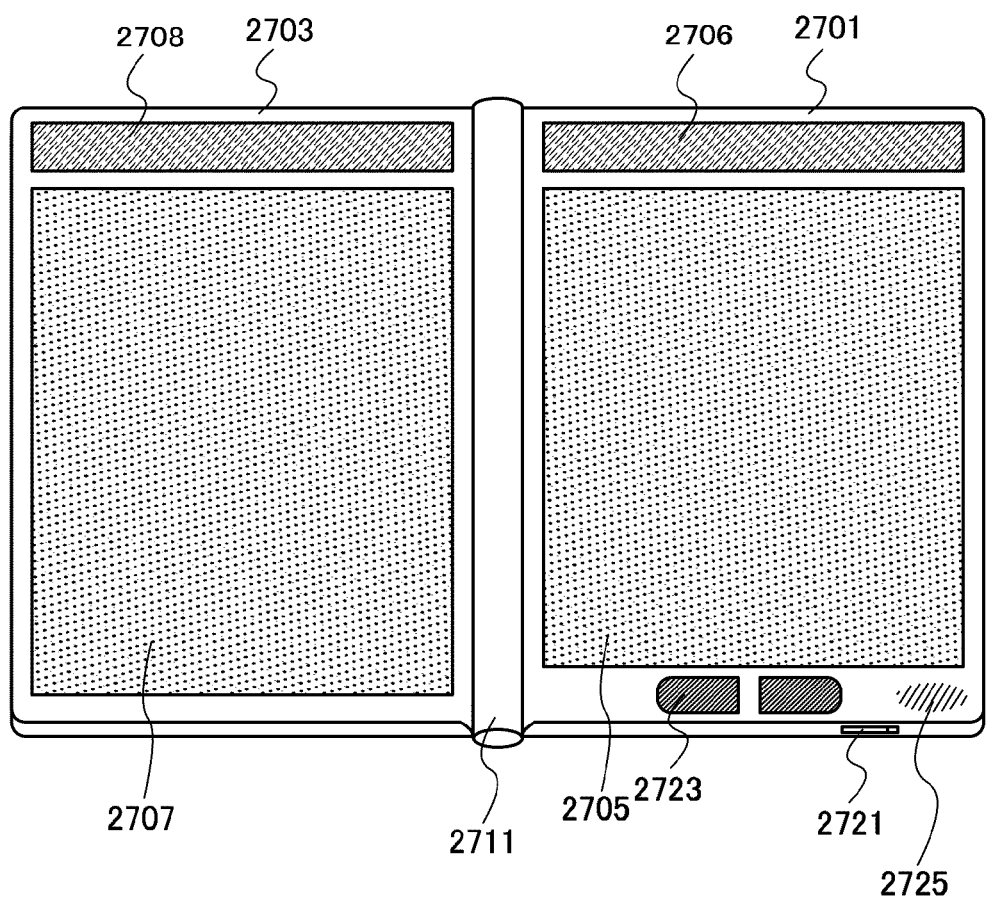
FIG. 11 is an external view illustrating an example of an electronic book.

FIG. 11 illustrates an example of an electronic book. For example, an electronic book 2700 includes two housings, a housing 2701 and a housing 2703. The housing 2701 and the housing 2703 are combined with a hinge 2711 so that the electronic book 2700 can be opened and closed with the hinge 2711 as an axis. With such a structure, the electronic book 2700 can operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. In the case where the display portion 2705 and the display portion 2707 display different images, for example, text can be displayed on a display portion on the right side (the display portion 2705 in FIG. 11) and graphics can be displayed on a display portion on the left side (the display portion 2707 in FIG. 11).

FIG. 11 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book 2700 may have a function of an electronic dictionary.

The electronic book 2700 may have a configuration capable of wirelessly transmitting and receiving data. Through wireless communication, desired book data or the like can be purchased and downloaded from an electronic book server.

Embodiment 10

A semiconductor device disclosed in this specification can be applied to a variety of electronic appliances (including game machines). Examples of electronic devices are a television set (also referred to as a television or a television receiver), a monitor of a computer or the like, a digital camera, a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 12A:
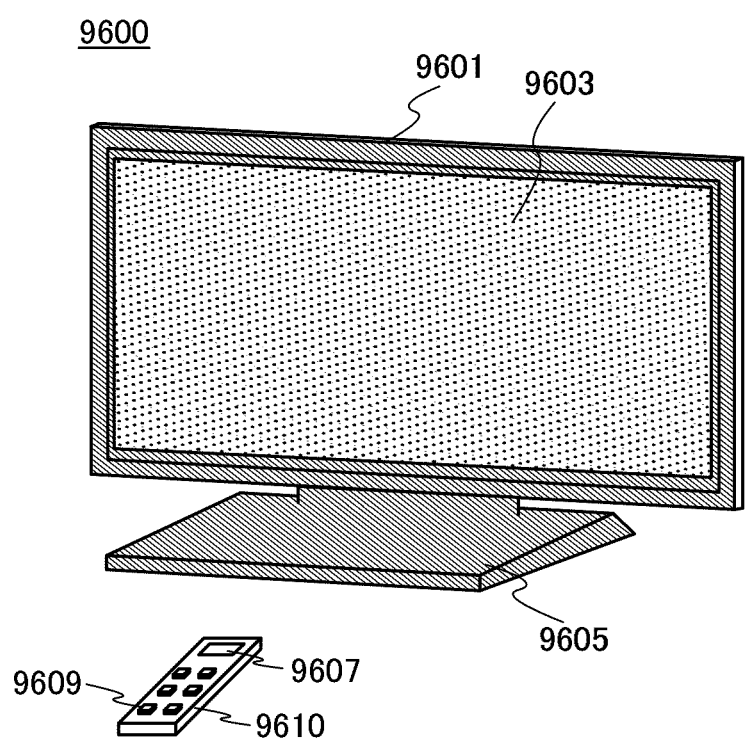
FIGS. 12A and 12B are external views showing examples of a television set and a digital photo frame.

FIG. 12A illustrates an example of a television set. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers or the like) information communication can be performed.

Figure 12B:
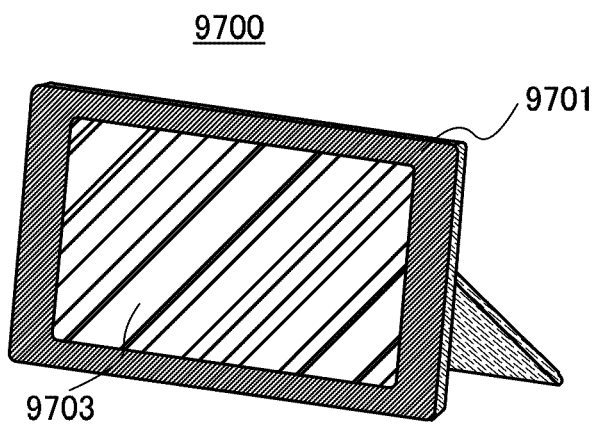

FIG. 12B illustrates an example of a digital photo frame. For example, in the digital photo frame 9700, a display portion 9703 is incorporated in a housing 9701. The display portion 9703 can display a variety of images. For example, the display portion 9703 can display data of an image taken with a digital camera or the like and serve as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 13:
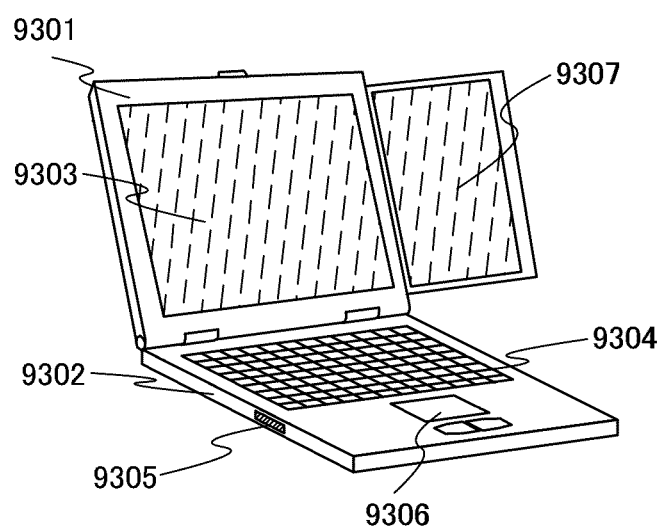
FIG. 13 is an external view illustrating an example of a laptop computer.

FIG. 13 is a perspective view illustrating an example of a laptop computer.

In the laptop computer illustrated in FIG. 13, a top housing 9301 having a display portion 9303 and a bottom housing 9302 having a keyboard 9304 can overlap with each other by closing hinge unit which connects the top housing 9301 and the bottom housing 9302. The laptop computer illustrated in FIG. 13 is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. Further, when the display portion 9303 is a touch input panel, input can be performed by touching part of the display portion 9303. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. If the display portion 9307 which can be stored is a touch screen, the user can input data by touching part of the display portion 9307 which can be stored.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the laptop computer illustrated in FIG. 13 can include a receiver and the like and can receive a TV broadcast to display images on the display portion. While the hinge unit which connects the top housing 9301 and the bottom housing 9302 is kept closed, the whole screen of the display portion 9307 is drawn out from the top housing 9301 by sliding the display portion 9307 out and the angle of the screen is adjusted; thus, the user can watch a television broadcast. In this case, the hinge unit is not opened and display is not performed on the display portion 9303. In addition, start up of only a circuit for displaying a television broadcast is performed. Therefore, power can be consumed to the minimum, which is useful for the laptop computer whose battery capacity is limited.

Example 1

In this example, the relation between the deposition condition and the crystallinity of a silicon carbide film is described with reference to FIG. 14 and FIGS. 15A and 15B.

First, a method for manufacturing Sample 1 is described.

After an insulating film was formed over a glass substrate, the insulating film was exposed to $N_2O$ plasma. Here, as the insulating film, a 100-nm-thickness silicon nitride film was formed. The silicon nitride film was formed by a plasma CVD method.

Next, a 70-nm-thickness microcrystalline silicon film was formed over the insulating film.

The microcrystalline silicon film was deposited by a plasma CVD method in which plasma discharge was performed under the following condition: the source gases were introduced and stabilized, where the flow rate of $SiH_4$ was 3 sccm, the flow rate of $H_2$ was 750 sccm, and the flow rate of Ar was 750 sccm; the pressure in the process chamber was 1237 Pa; an RF power source frequency was 13.56 MHz; and power with an RF power source was 45 W. Note that the microcrystalline semiconductor film was deposited with use of a parallel plate plasma apparatus. The temperature of an upper electrode was 250° C. and the temperature of a lower electrode was 300° C.

By the above steps, Sample 1 was manufactured.

Next, a method for manufacturing Samples 2 to 8 is described.

Samples 2 to 8 were formed in the following manner, as in Sample 1. After a 100-nm-thickness insulating film was formed over the glass substrate, the insulating film was exposed to $N_2O$ plasma. Then, a 70-nm-thickness microcrystalline silicon film was formed.

After that, an 80-nm-thickness silicon carbide film was formed over the microcrystalline silicon film.

The silicon carbide film was formed by a plasma CVD method in which plasma discharge was performed under the following condition: the source gases were introduced and stabilized; the pressure of the process chamber was 1237 Pa; an RF power source frequency was 13.56 MHz; and power with an RF power source was 45 W. Note that the silicon carbide film was deposited with use of a parallel plate plasma treatment apparatus. The temperature of an upper electrode was 250° C. and the temperature of a lower electrode was 300° C. The conditions of the flow rates of source gases of the samples were as follows:

Sample 2: the flow rate of $CH_3SiH_3$ was 2 sccm, the flow rate of $SiH_4$ was 3 sccm, the flow rate of $H_2$ was 750 sccm, and the flow rate of Ar was 750 sccm.

Sample 3: the flow rate of $CH_3SiH_3$ was 3 sccm, the flow rate of $SiH_4$ was 3 sccm, the flow rate of $H_2$ was 750 sccm, and the flow rate of Ar was 750 sccm.

Sample 4: the flow rate of $CH_3SiH_3$ was 4 sccm, the flow rate of $SiH_4$ was 3 sccm, the flow rate of $H_2$ was 750 sccm, and the flow rate of Ar was 750 sccm.

Sample 5: the flow rate of $CH_3SiH_3$ was 5 sccm, the flow rate of $SiH_4$ was 3 sccm, the flow rate of $H_2$ was 750 sccm, and the flow rate of Ar was 750 sccm.

Sample 6: the flow rate of $CH_3SiH_3$ was 6 sccm, the flow rate of $SiH_4$ was 3 sccm, the flow rate of $H_2$ was 750 sccm, and the flow rate of Ar was 750 sccm.

Sample 7: the flow rate of $CH_3SiH_3$ was 7 sccm, the flow rate of $SiH_4$ was 3 sccm, the flow rate of $H_2$ was 750 sccm, and the flow rate of Ar was 750 sccm.

Sample 8: the flow rate of $CH_3SiH_3$ was 8 sccm, the flow rate of $SiH_4$ was 3 sccm, the flow rate of $H_2$ was 750 sccm, and the flow rate of Ar was 750 sccm.

Next, the crystallinity of the films formed in Samples 1 to 8 was analyzed by Raman spectroscopy. Here, the Raman spectroscopy analysis was performed with the use of LabRAM HR-PL manufactured by HORIBA, Ltd. FIG. 14 shows the ratio of crystalline/amorphous intensity (Ic/Ia) of the samples. A circle represents the ratio of crystalline/amorphous intensity when the samples are irradiated with laser light which is visible light having a wavelength of 532 nm. A triangle represents the ratio of crystalline/amorphous intensity when the samples are irradiated with laser light which is UV light. The crystallinity of the entire film can be measured by irradiation with visible light. On the other hand, the crystallinity of a surface of the film can be measured by irradiation with UV light.

Figure 14:
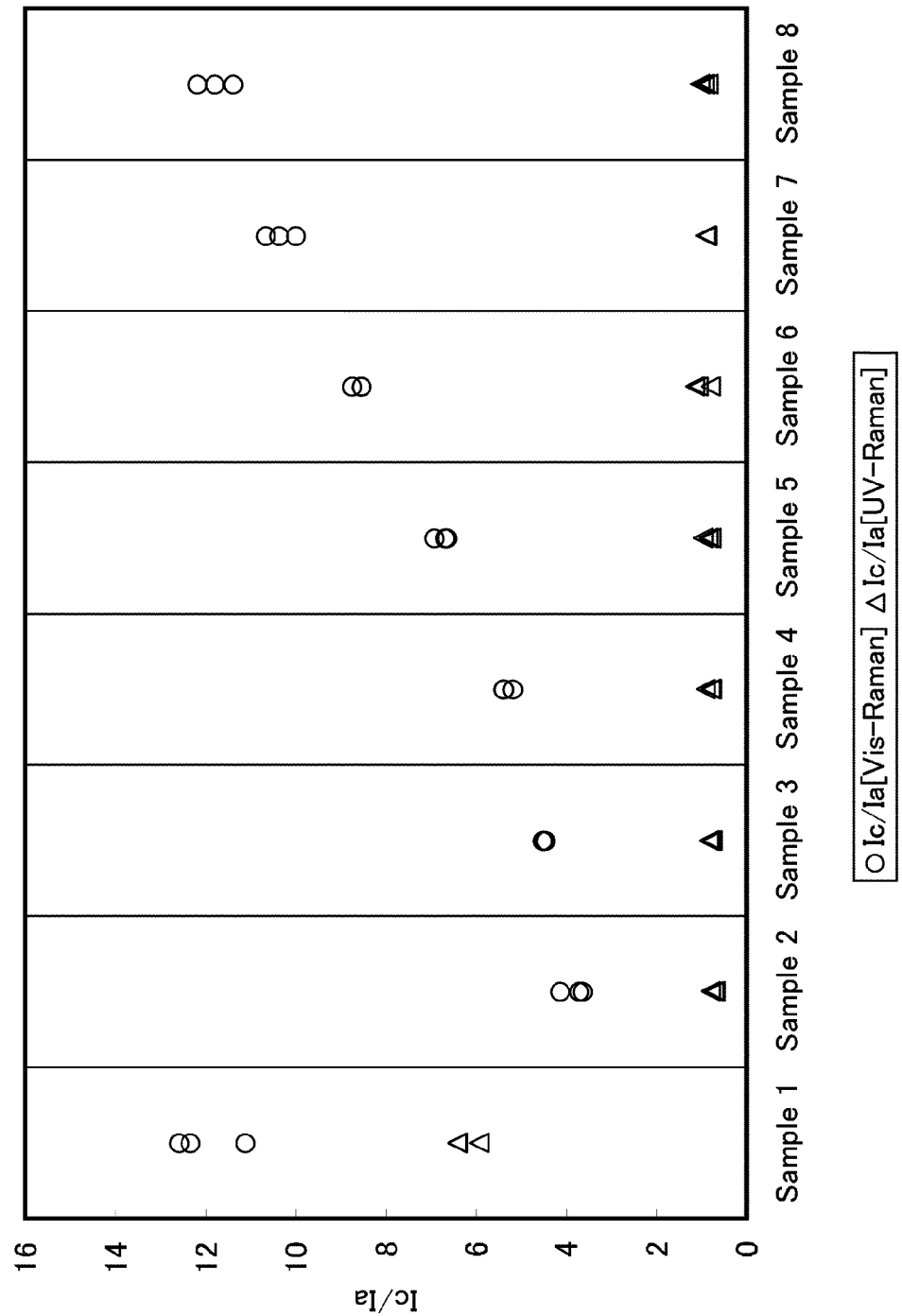
FIG. 14 is a graph showing the ratio of crystalline/amorphous intensity of the silicon carbide film.

As shown in FIG. 14, the ratio of the crystalline/amorphous intensity when Samples 2 to 8 are irradiated with UV light is constant and the average value is 1 or less. Therefore, it is observed that surfaces of Samples 2 to 8, that is, surfaces of the silicon carbide films are amorphous.

On the other hand, the ratio of crystalline/amorphous intensity when Samples 2 to 8 are irradiated with visible light is increased with the flow rate of $CH_3SiH_3$. As the flow rate of $CH_3SiH_3$ is increased, the concentration of carbon included in the silicon carbide films is also increased and the band gap gets wider. Consequently, visible light easily passes through the silicon carbide film. Visible light passing through the silicon carbide film reaches the microcrystalline silicon film formed below the silicon carbide film, and the Raman scattering of the microcrystalline silicon film occurs. Accordingly, as the flow rate of $CH_3SiH_3$ is increased, the ratio of crystalline/amorphous intensity in appearance is also increased.

Thus, by the increase in the flow rate of $CH_3SiH_3$, the silicon carbide film can be formed.

Figure 15A:
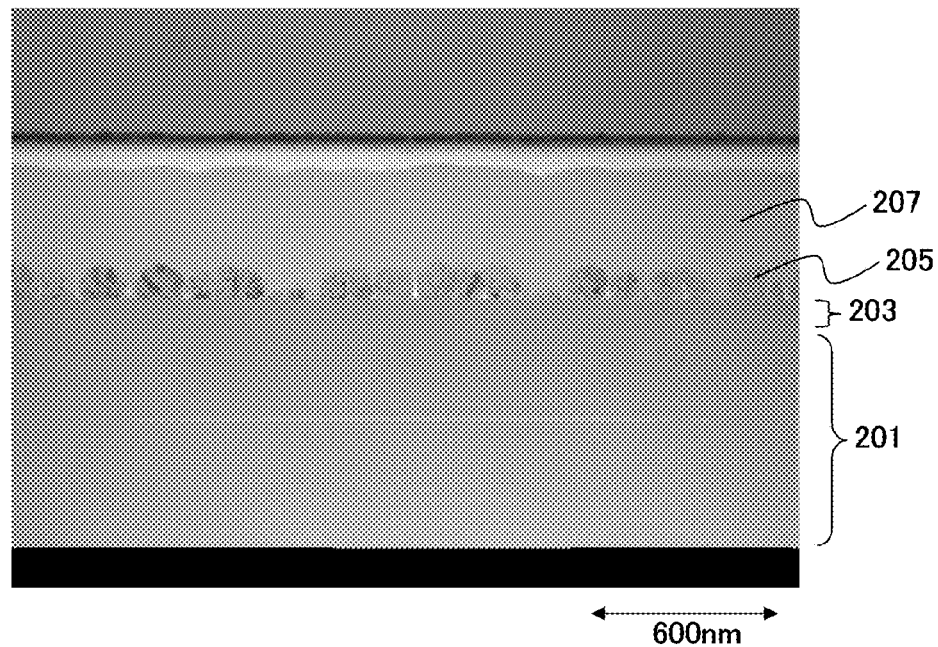
FIGS. 15A and 15B are cross-sectional STEM images.
Figure 15B:
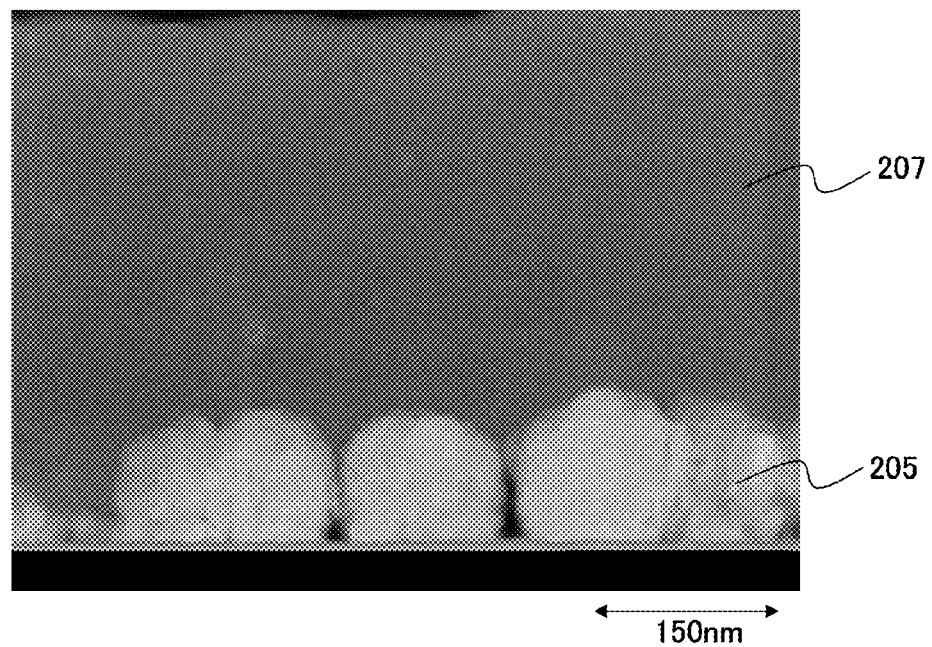

Next, FIGS. 15A and 15B show the results obtained by observation of a cross section of Sample 8 with STEM (scanning transmission electron microscopy). Here, the cross section was measured by "Ultra-thin film evaluation system HD-2300", which is manufactured by Hitachi High-Technologies Corporation. FIG. 15A is a phase contrast image (TE image) taken at a magnification of ×50000. FIG. 15B is a Z contrast image (ZC image) taken at a magnification of ×200000 of the vicinity of the microcrystalline silicon film 205 and the amorphous silicon carbide film 207. As shown in FIGS. 15A and 15B, an insulating film 203 is formed over a glass substrate 201 and the microcrystalline silicon film 205 is formed over the insulating film 203. It is observed that an amorphous silicon carbide film 207 is formed over the microcrystalline silicon film 205.

This application is based on Japanese Patent Application serial no. 2010-058529 filed with the Japan Patent Office on Mar. 15, 2010, the entire contents of which are hereby incorporated by reference.

What is claimed is:
1. A semiconductor device comprising:
a substrate;
a gate electrode over the substrate;
a gate insulating film over the gate electrode;
a microcrystalline silicon film over the gate insulating film;
a pair of silicon carbide films over the microcrystalline silicon film;
a pair of impurity semiconductor films over the pair of silicon carbide films; and
a wiring over one of the pair of impurity semiconductor films.

2. A semiconductor device according to claim 1, further comprising an insulating region provided between side surfaces of the microcrystalline silicon film and the pair of silicon carbide films, and the wiring.

3. A semiconductor device comprising:
a substrate;
a first gate electrode over the substrate;
a gate insulating film over the first gate electrode;
a microcrystalline silicon film over the gate insulating film;
a pair of silicon carbide films over the microcrystalline silicon film;
a pair of impurity semiconductor films over the pair of silicon carbide films;
a wiring over one of the pair of impurity semiconductor films;
an insulating film over the wiring; and
a second gate electrode is formed over the insulating film.

4. A semiconductor device according to claim 3, further comprising an insulating region provided between side surfaces of the microcrystalline silicon film and the pair of silicon carbide films, and the wiring.

5. A semiconductor device according to claim 3, wherein the second gate electrode is formed in parallel to the first gate electrode.

6. A semiconductor device according to claim 3, wherein the second gate electrode is electrically connected to the first gate electrode.

7. A semiconductor device according to claim 3, wherein the second gate electrode is in a floating state.

8. A semiconductor device according to claim 3, wherein the second gate electrode overlaps with the wiring.

9. A semiconductor device comprising:
a substrate;
a gate electrode over the substrate;
a gate insulating film over the gate electrode;
a microcrystalline silicon film over the gate insulating film;
a pair of amorphous silicon carbide films over the microcrystalline silicon film;
a pair of impurity semiconductor films over the pair of amorphous silicon carbide films; and
a wiring over one of the pair of impurity semiconductor films.

10. A semiconductor device according to claim 9, further comprising an insulating region provided between side surfaces of the microcrystalline silicon film and the pair of amorphous silicon carbide films, and the wiring.

11. A semiconductor device according to claim 9, further comprising a pair of microcrystalline silicon films including carbon between the microcrystalline silicon film and the pair of amorphous silicon carbide films.

12. A semiconductor device according to claim 9, further comprising a pair of microcrystalline silicon films including nitrogen and a pair of amorphous silicon films including nitrogen between the microcrystalline silicon film and the pair of amorphous silicon carbide films.

13. A semiconductor device according to claim 9, further comprising a pair of microcrystalline silicon films including nitrogen and a pair of microcrystalline silicon carbide films between the microcrystalline silicon film and the pair of amorphous silicon carbide films.

14. A semiconductor device according to claim 9, further comprising a pair of microcrystalline silicon films including carbon and nitrogen and a pair of amorphous silicon films including carbon and nitrogen between the microcrystalline silicon film and the pair of amorphous silicon carbide films.

15. A semiconductor device comprising:
a substrate;
a first gate electrode over the substrate;
a gate insulating film over the first gate electrode;
a microcrystalline silicon film over the gate insulating film;
a pair of amorphous silicon carbide films over the microcrystalline silicon film;
a pair of impurity semiconductor films over the pair of amorphous silicon carbide films;
a wiring over one of the pair of impurity semiconductor films;
an insulating film over the wiring; and
a second gate electrode is formed over the insulating film.

16. A semiconductor device according to claim 15, further comprising an insulating region provided between side surfaces of the microcrystalline silicon film and the pair of amorphous silicon carbide films, and the wiring.

17. A semiconductor device according to claim 15, wherein the second gate electrode is formed in parallel to the first gate electrode.

18. A semiconductor device according to claim 15, wherein the second gate electrode is electrically connected to the first gate electrode.

19. A semiconductor device according to claim 15, wherein the second gate electrode is in a floating state.

20. A semiconductor device according to claim 15, wherein the second gate electrode overlaps with the wiring.

21. A semiconductor device comprising:
a substrate;
a gate electrode over the substrate;
a gate insulating film over the gate electrode;
a microcrystalline silicon film over the gate insulating film;
a pair of microcrystalline silicon carbide films over the microcrystalline silicon film;
a pair of impurity semiconductor films over the pair of microcrystalline silicon carbide films; and
a wiring over one of the pair of impurity semiconductor films.

22. A semiconductor device according to claim 21, further comprising an insulating region provided between side surfaces of the microcrystalline silicon film and the pair of microcrystalline silicon carbide films, and the wiring.

23. A semiconductor device according to claim 21, further comprising a pair of microcrystalline silicon films including carbon between the microcrystalline silicon film and the pair of microcrystalline silicon carbide films.

24. A semiconductor device according to claim 21, further comprising a pair of microcrystalline silicon films including nitrogen between the microcrystalline silicon film and the pair of microcrystalline silicon carbide films.

25. A semiconductor device according to claim 21, further comprising a pair of microcrystalline silicon films including carbon and nitrogen between the microcrystalline silicon film and the pair of microcrystalline silicon carbide films.

26. A semiconductor device comprising:
- a substrate;
- a first gate electrode over the substrate;
- a gate insulating film over the first gate electrode;
- a microcrystalline silicon film over the gate insulating film;
- a pair of microcrystalline silicon carbide films over the microcrystalline silicon film;
- a pair of impurity semiconductor films over the pair of microcrystalline silicon carbide films;
- a wiring over one of the pair of impurity semiconductor films;
- an insulating film over the wiring; and
- a second gate electrode is formed over the insulating film.

27. A semiconductor device according to claim 26, further comprising an insulating region provided between side surfaces of the microcrystalline silicon film and the pair of microcrystalline silicon carbide films, and the wiring.

28. A semiconductor device according to claim 26, wherein the second gate electrode is formed in parallel to the first gate electrode.

29. A semiconductor device according to claim 26, wherein the second gate electrode is electrically connected to the first gate electrode.

30. A semiconductor device according to claim 26, wherein the second gate electrode is in a floating state.

31. A semiconductor device according to claim 26, wherein the second gate electrode overlaps with the wiring.

* * * * *